United States Patent
Yamazaki et al.

(10) Patent No.: US 7,052,943 B2
(45) Date of Patent: May 30, 2006

(54) METHOD OF MANUFACTURING A SEMICONDUCTOR DEVICE

(75) Inventors: Shunpei Yamazaki, Tokyo (JP); Hideto Ohnuma, Kanagawa (JP); Koji Dairiki, Kanagawa (JP); Toru Mitsuki, Kanagawa (JP); Toru Takayama, Kanagawa (JP); Kengo Akimoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/097,641

(22) Filed: Mar. 15, 2002

(65) Prior Publication Data

US 2002/0164843 A1     Nov. 7, 2002

(30) Foreign Application Priority Data

Mar. 16, 2001 (JP) .............................. 2001-075141
Sep. 28, 2001 (JP) .............................. 2001-301276

(51) Int. Cl.
*H01L 21/84*     (2006.01)

(52) U.S. Cl. ........................ 438/166; 438/476
(58) Field of Classification Search ........ 438/151–166, 438/476
See application file for complete search history.

(56) References Cited

U.S. PATENT DOCUMENTS

| | | |
|---|---|---|
| 3,535,775 A | 10/1970 | Garfinkel et al. |
| 4,371,403 A | 2/1983 | Ikubo et al. |
| 4,477,308 A | 10/1984 | Gibson et al. |
| 4,534,820 A | 8/1985 | Mori et al. |
| 4,727,044 A * | 2/1988 | Yamazaki .................. 438/166 |
| 5,244,819 A | 9/1993 | Yue |
| 5,248,630 A * | 9/1993 | Serikawa et al. ........... 438/166 |
| 5,275,896 A | 1/1994 | Garofalo |
| 5,403,772 A | 4/1995 | Zhang et al. |
| 5,426,064 A | 6/1995 | Zhang et al. |
| 5,481,121 A | 1/1996 | Zhang et al. |

(Continued)

FOREIGN PATENT DOCUMENTS

EP     0 651 431 A2     5/1995

(Continued)

OTHER PUBLICATIONS

U.S. Appl. No. 10/056,055, including specification, drawings and filing receipt, "Semiconductor Device and Manufacturing Method of the Same", Osamu Nakamura et al., filed Jan. 28, 2002.

(Continued)

*Primary Examiner*—Richard A. Booth
(74) *Attorney, Agent, or Firm*—Eric J. Robinson; Robinson Intellectual Property Law Office, PC

(57) ABSTRACT

A technique of using a metal element that has a catalytic action over crystallization of a semiconductor film to obtain a crystalline semiconductor film and then effectively removing the metal element remaining in the film is provided. A first semiconductor film (104) having a crystal structure is formed on a substrate. A barrier layer (105) and a second semiconductor film (106) containing a rare gas element are formed on the first semiconductor film (104). A metal element contained in the first semiconductor film (104) is moved to the second semiconductor film (106) through the barrier layer (105) by heat treatment for gettering.

64 Claims, 27 Drawing Sheets

U.S. PATENT DOCUMENTS

| | | | |
|---|---|---|---|
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohatani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A * | 4/2000 | Yamazaki et al. | 438/166 |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A * | 6/2000 | Yamazaki et al. | 438/150 |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 * | 1/2001 | Battaglia et al. | 438/164 |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 * | 9/2001 | Nagamine et al. | 438/770 |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B1 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,276 B1 | 7/2002 | Ohnuma et al. |
| 6,429,097 B1 | 8/2002 | Voutsas et al. |
| 6,436,745 B1 * | 8/2002 | Gotou et al. | 438/166 |
| 6,461,943 B1 | 10/2002 | Yamazaki et al. |
| 6,489,189 B1 | 12/2002 | Yamazaki et al. |
| 6,512,504 B1 | 1/2003 | Yamauchi et al. |
| 6,531,713 B1 | 3/2003 | Yamazaki |
| 6,534,826 B1 | 3/2003 | Yamazaki |
| 6,541,294 B1 | 4/2003 | Yamazaki et al. |
| 6,576,926 B1 | 6/2003 | Yamazaki et al. |
| 6,579,736 B1 | 6/2003 | Yamazaki |
| 6,680,577 B1 | 1/2004 | Inukai et al. |
| 6,690,068 B1 | 2/2004 | Yamazaki et al. |

| | | |
|---|---|---|
| 6,709,902 B1 | 3/2004 | Kitakado et al. |
| 6,737,304 B1 | 5/2004 | Yamazaki et al. |
| 6,743,649 B1 | 6/2004 | Yamazaki et al. |
| 6,787,807 B1 | 9/2004 | Yamazaki et al. |
| 2001/0034088 A1 | 10/2001 | Nakamura et al. |
| 2002/0028543 A1 | 3/2002 | Yamazaki et al. |
| 2002/0038889 A1 | 4/2002 | Yamazaki et al. |
| 2002/0086469 A1 | 7/2002 | Kim et al. |
| 2002/0102764 A1 | 8/2002 | Yamazaki et al. |
| 2002/0106861 A1 | 8/2002 | Yamazaki |
| 2002/0142554 A1 | 10/2002 | Nakajima |
| 2002/0151120 A1 | 10/2002 | Yamazaki et al. |
| 2002/0151154 A1 | 10/2002 | Yamazaki et al. |
| 2002/0164843 A1 | 11/2002 | Yamazaki et al. |
| 2002/0187594 A1 | 12/2002 | Yamazaki et al. |
| 2002/0197785 A1 | 12/2002 | Yamazaki et al. |
| 2003/0060057 A1* | 3/2003 | Raaijmakers et al. ....... 438/770 |
| 2003/0062499 A1 | 4/2003 | Yamazaki |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2004/0065902 A1 | 4/2004 | Yamazaki et al. |
| 2004/0108576 A1 | 6/2004 | Yamazaki et al. |

FOREIGN PATENT DOCUMENTS

| | | |
|---|---|---|
| JP | 05-109737 | 4/1993 |
| JP | 06-151414 | 5/1994 |
| JP | 07-130652 | 5/1995 |
| JP | 07-183540 | 7/1995 |
| JP | 08-78329 | 3/1996 |
| JP | 09-074207 | 3/1997 |
| JP | 10-055951 | 2/1998 |
| JP | 3032801 | 9/1998 |
| JP | 2000-105081 | 4/2000 |
| JP | 2000-260777 | 9/2000 |
| JP | 2001-210828 | 8/2001 |
| JP | 2001-267264 | 9/2001 |

OTHER PUBLICATIONS

U.S. Appl. No. 10/072,931, including specification, drawings and filing receipt, "Method of Manufacturing a Semiconductor Device", Shunpei Yamazaki et al., filed Feb. 12, 2002.

U.S. Appl. No. 10/074,050, including specification, drawings and filing receipt, "Method of Manufacturing a Semiconductor Device", Shunpei Yamazaki et al., filed Feb. 14, 2002.

U.S. Appl. No. 10/051,064, including specification, drawings and filing receipt, "Semiconductor Device and Method of Manufacturing the Same", filed Jan. 18, 2002.

U.S. Appl. No. 10/066,542, including specification, drawings and filing receipt, "Semiconductor Device and Method for Manufacturing the Same", filed Feb. 5, 2002.

U.S. Appl. No. 10/020,961, including specification, drawings and filing receipt, "Method of Manufacturing Semiconductor Device and Semiconductor Device", filed Dec. 19, 2001.

M. Miyake et al., "Characteristics of Buried-Channel pMOS Devices with Shallow Counter-Doped Layers Fabricated Using Channel Preamorphization", IEEE Transactions on Electron Devices, vol. 43, No. 3, Mar. 1996, pp. 444-449.

L. S. Lee et al., "Argon Ion-Implantation on Polysilicon or Amorphous-Silicon for Boron Penetration Suppression in p+ pMOSFET", IEEE Transactions on Electron Devices, vol. 45, No. 8, Aug. 1998, pp. 1737-1744.

D.J. Llewellyn et al., *Implantation and Annealing of Cu in InP for Electrical Isolation: Microstructural Characterisation*, IEEE, 1997, pp. 313-316.

Kevin S. Jones et al., *Boron Diffusion Upon Annealing of Laser Thermal Processed Silicon*, IEEE, 2000, pp. 111-114.

\* cited by examiner

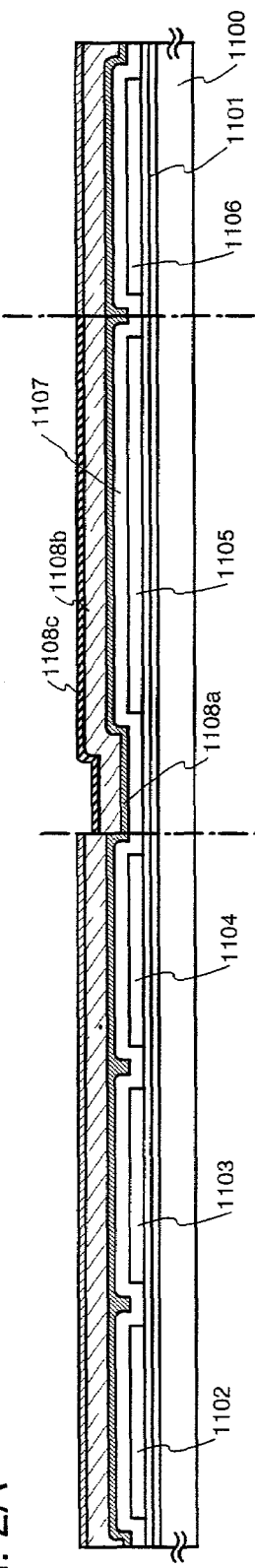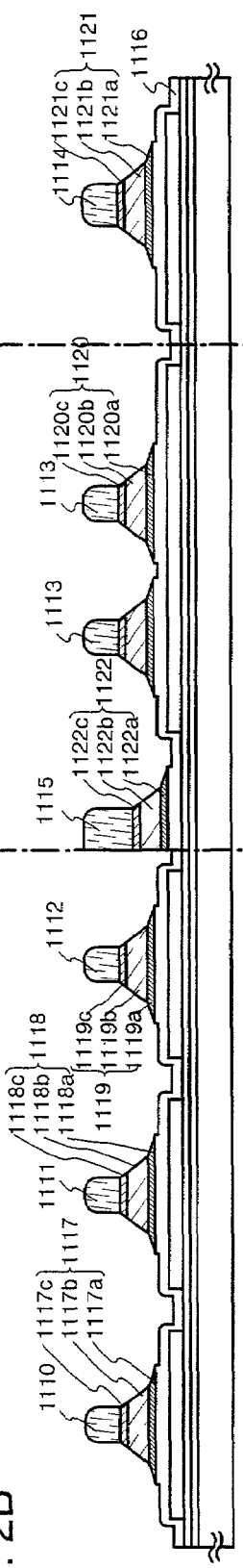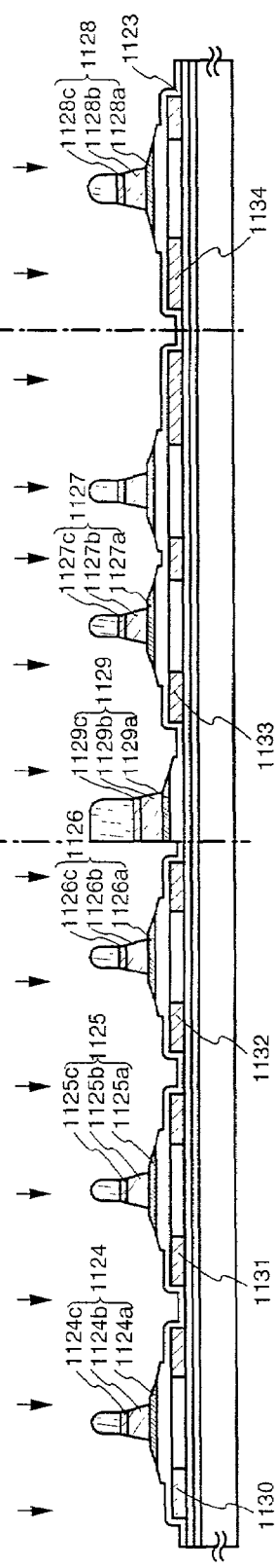

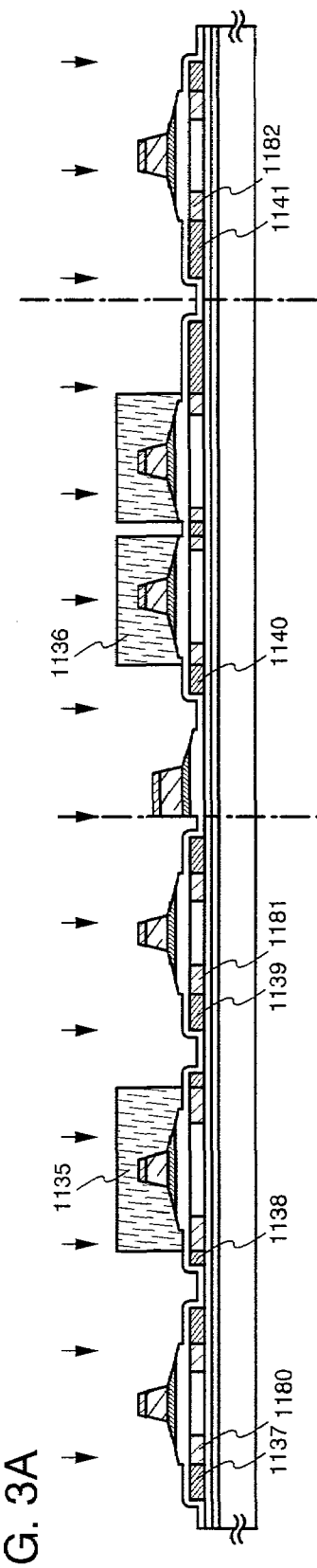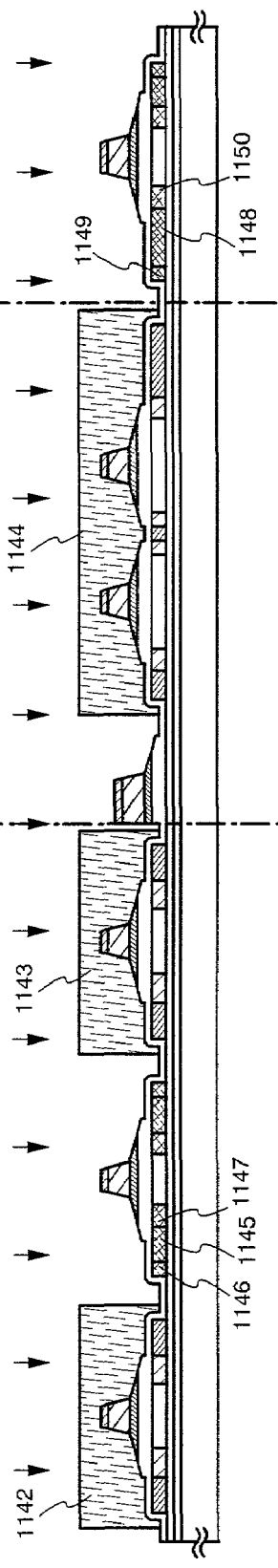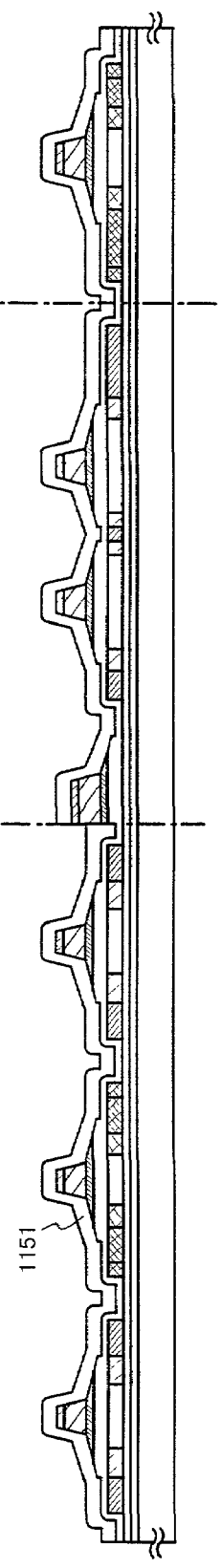

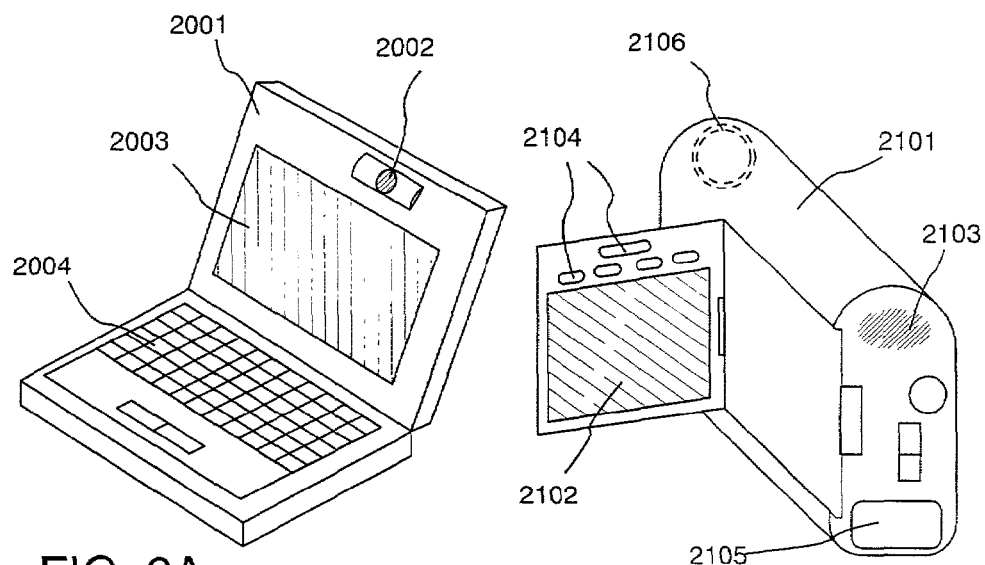
FIG. 9A
FIG. 9B
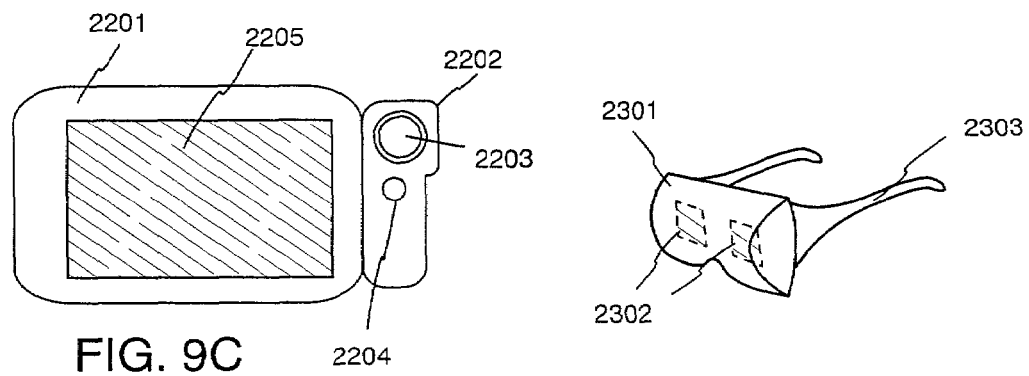
FIG. 9C
FIG. 9D
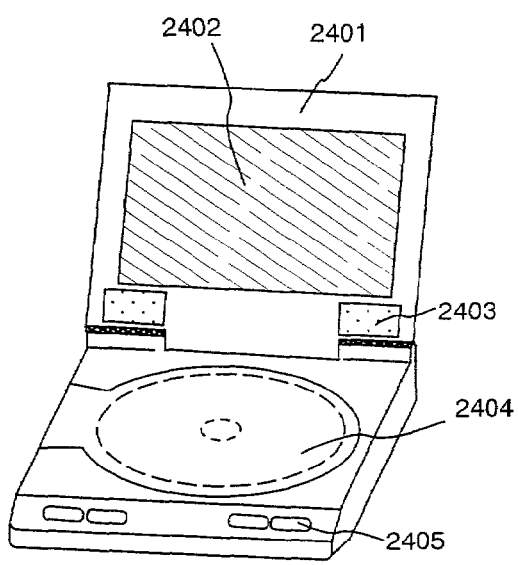
FIG. 9E
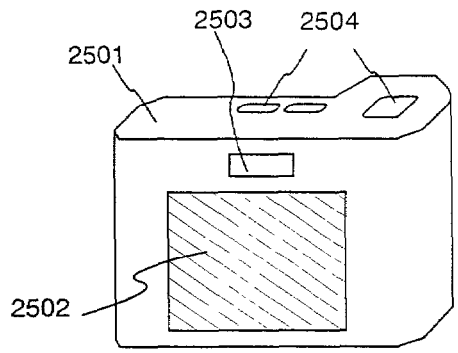
FIG. 9F

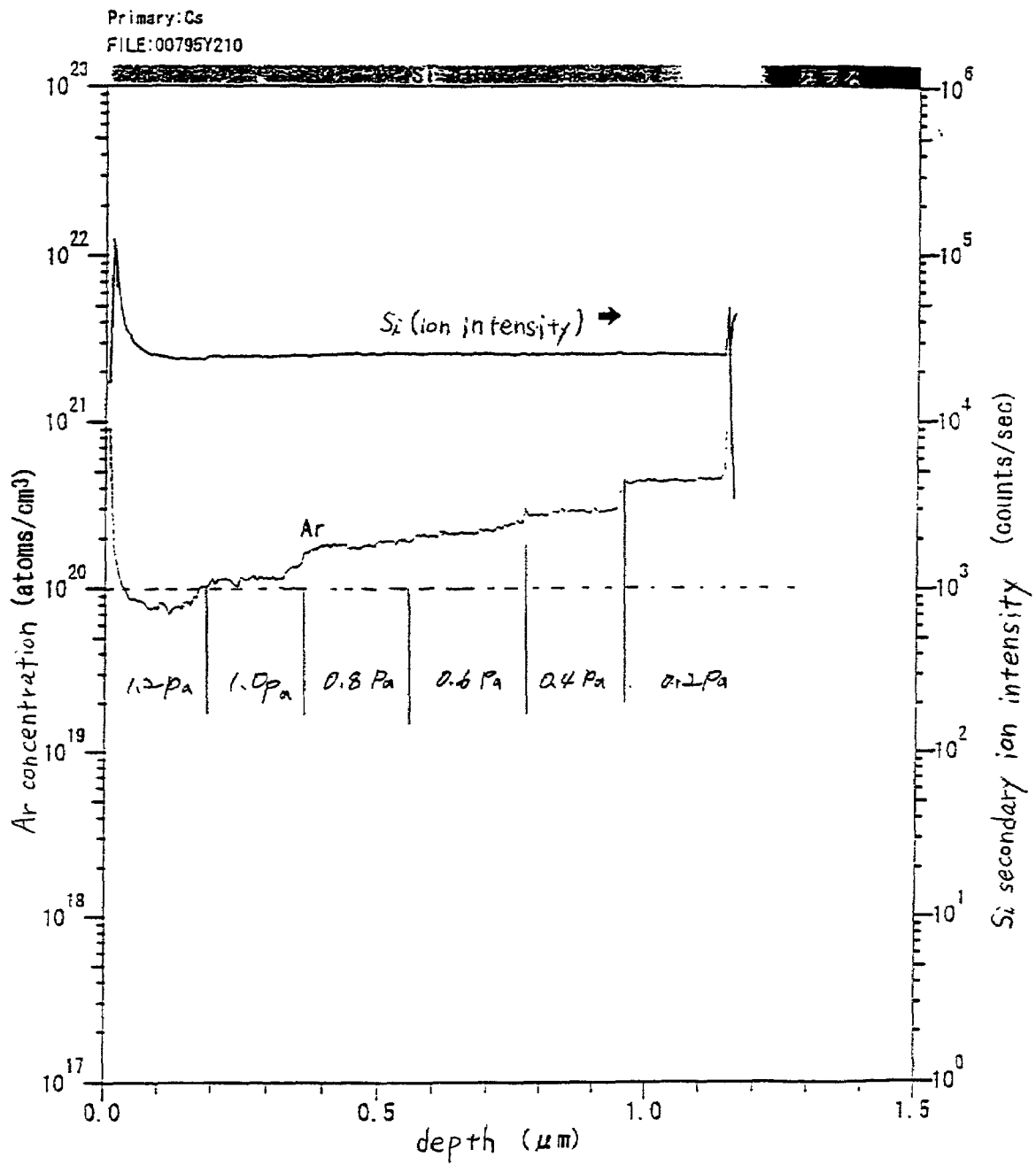

FIG. 15A  20 nm of Si film by sputtering in Ar
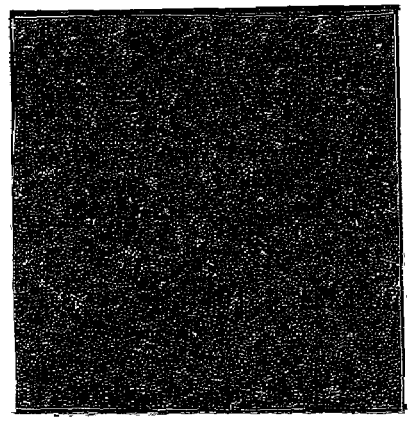
FIG. 15B  50 nm of Si film by sputtering in Ar
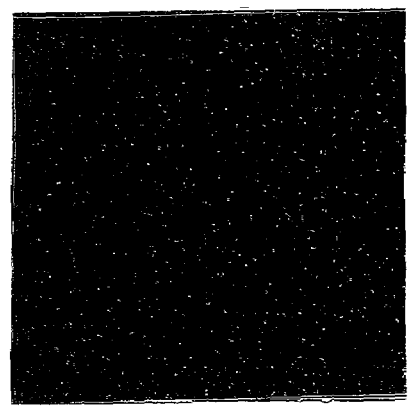
FIG. 15C  150 nm of Si film by sputtering in Ar
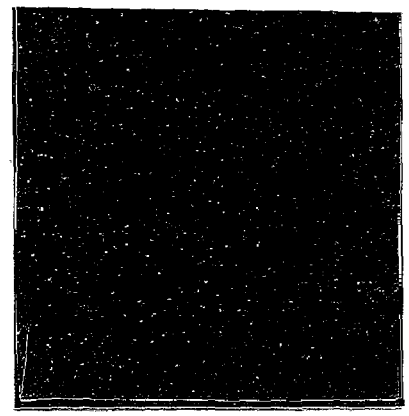

METHOD OF MANUFACTURING A SEMICONDUCTOR DEVICE

BACKGROUND OF THE INVENTION

1. Field of the Invention

The present invention relates to a method of manufacturing a semiconductor device using a gettering technique. Specifically, the present invention relates to a method of manufacturing a semiconductor device from a semiconductor film which has a crystal structure and which is doped with a metal element for accelerating crystallization thereof.

The term semiconductor device in this specification refers to devices in general that utilize semiconductor characteristics to function, and electrooptical devices, semiconductor circuits, and electronic equipment are all deemed as semiconductor devices.

2. Description of the Related Art

Thin film transistors (hereinafter referred to as TFTs) are known as typical semiconductor elements that use semiconductor films having a crystal structure. TFTs are attracting attention as a technique of forming an integrated circuit on a glass or other insulating substrate, and devices utilizing TFTs, such as a liquid crystal display device with a built-in driving circuit, are beginning to appear on the market. In prior art, a semiconductor film with a crystal structure is formed by using heat treatment or laser annealing to crystallize an amorphous semiconductor film that is obtained by deposition through plasma CVD or low pressure CVD. (Laser annealing is the technique of crystallizing a semiconductor film through irradiation of laser light.)

The thus formed semiconductor film with a crystal structure is a mass of crystal grains. Since the crystal grains are randomly oriented and the orientation thereof cannot be controlled, the semiconductor film affects TFT characteristics. Japanese Patent Application Laid-open No. Hei 7-183540 discloses a technique to tackle this problem. The technique involves doping with a metal element that accelerates crystallization of a semiconductor film, such as nickel, to form a semiconductor film having a crystal structure. The technique can cause a large proportion of crystal grains to orient in the same direction, and can lower the heating temperature required for crystallization as well. When this semiconductor film having a crystal structure is used in a TFT, the field effect mobility is improved and the subthreshold coefficient (S value) is reduced to improve the electric characteristics of the TFT exponentially.

On the other hand, the metal element used in doping for accelerating crystallization remains in the semiconductor film having a crystal structure, or on the surface thereof, causing problems such as fluctuation in characteristic of semiconductor elements obtained. For example, the remaining metal element increases OFF current in the TFTs to cause fluctuation between the semiconductor elements. In short, the metal element for accelerating crystallization becomes an unwanted presence once the semiconductor film having a crystal structure is formed.

Gettering using phosphorus is actively employed as an effective method of removing a metal element that accelerates crystallization from a specific region of a semiconductor film having a crystal structure. For instance, the metal element can readily be removed from a channel formation region by doping a source or drain region of a TFT with phosphorus and subjecting the film to heat treatment at 450 to 700° C.

Phosphorus is injected to the semiconductor film having a crystal structure by ion doping (ion doping is a method of dissociating PH3 or the like by plasma and accelerating the obtained ions in the electric field to inject the ions into a semiconductor, and basically does not include ion mass separation). For gettering, the concentration of phosphorus in the semiconductor film has to be $1\times10^{20}/cm^3$ or higher. Phosphorus doping by ion doping makes the semiconductor film having a crystal structure amorphous, and an increased phosphorus concentration inhibits recrystallization during the subsequent annealing. In addition to this problem, high concentration phosphorus doping prolongs treatment time required for doping and lowers throughput in the doping step.

Furthermore, a source or drain region of a p-channel TFT which is doped with phosphorus needs boron in a concentration 1.5 to 3 times higher than the phosphorus concentration in order to reverse the conductivity type of the region. This makes the recrystallization difficult and raises the resistance of the source or drain region undesirably.

SUMMARY OF THE INVENTION

The present invention has been made to solve these problems, and an object of the present invention is therefore to provide a technique of using a metal element that accelerates crystallization of a semiconductor film to obtain a semiconductor film having a crystal structure and then effectively removing the metal element remaining in the film.

Gettering techniques are deemed as major techniques in integrated circuit manufacturing techniques using a single crystal silicon wafer. In gettering, metal impurities taken into a semiconductor segregate in a gettering site by some energy to reduce the impurity concentration in an active region of the semiconductor element. Gettering techniques are roughly divided into two; extrinsic gettering and intrinsic gettering. Extrinsic gettering provides a gettering effect by externally applied strain field or chemical actions. Phosphorus gettering, in which a high concentration of phosphorus is diffused from the back side of a single crystal silicon wafer, falls within the definition of extrinsic gettering. The gettering described in the above paragraph which uses phosphorus is also one of the extrinsic gettering techniques.

On the other hand, intrinsic gettering utilizes a strain field of a lattice defect caused by oxygen that is generated inside a single crystal silicon wafer. The present invention focuses attention on intrinsic gettering utilizing a lattice defect or lattice strain as such and, in order to apply intrinsic gettering to an approximately 10 to 100 nm thick semiconductor film having a crystal structure, employs the following measures.

The present invention is comprised of: a step of using a metal element to form on a silicon nitride film a first semiconductor film that has a crystal structure; a step of forming a film that serves as an etching stopper (barrier layer); a step of forming a second semiconductor film that contains a rare gas element (gettering site); a step of gettering to move the metal element to the gettering site; and a step of removing the second semiconductor film.

In the step of forming the second semiconductor film that contains a rare gas element (gettering site), a semiconductor film having an amorphous structure is formed by sputtering using a semiconductor target through glow discharge in an atmosphere that contains a rare gas element. The semiconductor target may contain an impurity element (phosphorus, arsenic, boron, or the like) that gives one conductivity type to the semiconductor (resistivity: 0.01 to 1000 Ωcm). If the semiconductor target containing an impurity element (phosphorus, arsenic, boron, or the like) has a resistivity of 0.01 to 1 Ωcm, the film may be formed by a sputtering apparatus that uses a DC power supply.

The rare gas element is one or more kinds of elements selected from the group consisting of He, Ne, Ar, Kr, and Xe. When the semiconductor film contains ions thereof, dangling bonds and lattice strain are formed to provide a gettering site.

The second semiconductor film that contains a rare gas element (gettering site) may be formed by other methods, and plasma CVD or low pressure thermal CVD using a raw material gas that contains a rare gas element may be employed. When forming the film by these methods, conditions therefor have to be adjusted so as to avoid peeling of the film.

Still another method of obtaining the second semiconductor film that contains a rare gas element is doping with a rare gas element through ion doping or ion implantation.

The second semiconductor film formed by sputtering, plasma CVD, or low pressure thermal CVD to contain a rare gas element in the film formation steps may further be doped with a rare gas element or one or more kinds of elements selected from the group consisting of H, $H_2$, O, $O_2$, P, and B. Doping with plural kinds of elements brings about synergetic gettering effects. O and $O_2$ are particularly effective and increase gettering effect when the final oxygen concentration in the second semiconductor film is $5\times10^{18}$/$cm^3$ or higher, preferably, $1\times10^{19}$ to $1\times10^{22}$/$cm^3$ by SIMS. Rare gas elements hardly diffuse. If other elements used along with the rare gas elements in the doping are easy to diffuse, it is preferable to form the second semiconductor film with an increased film thickness so as to prevent the other elements used in doping from diffusing into the first semiconductor film in the subsequent heat treatment. In addition to the second semiconductor film, the barrier layer also prevents diffusion of the other elements.

The present invention is characterized by using an insulating film formed of a silicon nitride film with a thickness of 10 nm or less as a base insulating film that is in contact with the first semiconductor film having a crystal structure to increase the gettering effect. The base insulating film has a blocking effect as well.

A structure of the invention disclosed in the present specification relates to a method of manufacturing a semiconductor device, characterized by comprising: a first step of forming on an insulating film a first semiconductor film that has an amorphous structure; a second step of doping the first semiconductor film that has an amorphous structure with a metal element; a third step of crystallizing the first semiconductor film to form a first semiconductor film that has a crystal structure; a fourth step of forming a barrier layer on the surface of the first semiconductor film that has a crystal structure; a fifth step of forming on the barrier layer a second semiconductor film that contains a rare gas element; a sixth step of gettering the metal element so that the metal element in the first semiconductor film that has a crystal structure is removed or reduced by moving the element to the second semiconductor film; and a seventh step of removing the second semiconductor film.

In the above structure, the base insulating film is preferably a silicon nitride film in order to increase the gettering effect.

Further, in the above structure, the concentration of oxygen contained in the first semiconductor film is preferably set to $5\times10^{18}$/$cm^3$ or lower in order to increase the gettering effect.

Further, in the above structure, the concentration of oxygen contained in the second semiconductor film is preferably higher than $5\times10^{18}$/$cm^3$ in order to increase the gettering effect.

Further, in the above structure, the method of the present invention is characterized in that the concentration of oxygen contained in the second semiconductor film is higher than the concentration of oxygen contained in the first semiconductor film in order to increase the gettering effect.

In the above structures, the third step includes one or a combination of heat treatment, intense light irradiation, and laser light irradiation (excimer laser light with a wavelength of 400 nm or less, or second harmonic or third harmonic of YAG laser).

In the above structures, the fourth step of forming the barrier layer may include oxidization of the surface of the semiconductor film having a crystal structure by laser light irradiation and further oxidization of the surface of the semiconductor film having a crystal structure by a solution containing ozone. Instead, in the above structures, the fourth step of forming the barrier layer may include oxidization of the surface of the semiconductor film having a crystal structure by a solution containing ozone or oxidization of the surface of the semiconductor film having a crystal structure by ultraviolet irradiation in an oxygen atmosphere. Alternatively, in the above structures, the fourth step of forming the barrier layer may include oxidization of the surface of the semiconductor film having a crystal structure by oxygen plasma treatment.

In this specification, the term barrier layer refers to a layer which has a film quality or film thickness that allows a metal element to pass in the gettering step and which functions as an etching stopper in the step of removing the layer that functions as a gettering site.

Further, in the above structures, the method of the present invention is characterized in that the second semiconductor film is formed by sputtering with a semiconductor as a target in an atmosphere containing a rare gas element.

Further, in the above structures, the method of the present invention is characterized in that the second semiconductor film is formed by sputtering with a semiconductor that contains phosphorus or boron as a target in an atmosphere containing a rare gas element.

Further, in the above structures, the method of the present invention is characterized in that the internal stress of the second semiconductor film is compressive stress.

In the above structures, the sixth step may employ heat treatment or irradiation of intense light on the semiconductor film having an amorphous structure. Alternatively, the sixth step may employ both of heat treatment and irradiation of intense light on the semiconductor film having an amorphous structure.

Further, in the above structures, the method of the present invention is characterized in that the intense light is light emitted from a halogen lamp, a metal halide lamp, a xenon arc lamp, a carbon arc lamp, a high-pressure sodium lamp, or a high-pressure mercury lamp.

Further, in the above structures, the method of the present invention is characterized in that the metal element is one or more kinds of elements selected from the group consisting of Fe, Ni, Co, Ru, Rh, Pd, Os, Ir, Pt, Cu, and Au.

The present invention is not limited to the structures above and a gettering site containing a rare gas element may be formed in an upper layer of the second semiconductor film alone. Alternatively, a gettering site may be formed in a third semiconductor film which contains a rare gas element and which is formed on a second semiconductor film that has no rare gas element.

Crystallization of the first semiconductor film and gettering may be simultaneously achieved by spraying nickel elements onto a silicon nitride film that is an insulating film through sputtering or the like, forming the first semiconductor film, forming the barrier layer, forming the second semiconductor film that contains a rare gas element, and then conducting heat treatment or irradiation of intense light.

BRIEF DESCRIPTION OF THE DRAWINGS

In the accompanying drawings:

FIGS. 2A to 2C are diagrams showing a process of manufacturing an active matrix substrate;

FIGS. 3A to 3C are diagrams showing a process of manufacturing an active matrix substrate;

FIGS. 9A to 9F are diagrams showing examples of electronic equipment;

FIG. 12 is a graph of concentration profile showing the relation between the sputtering film formation pressure and the Ar concentration;

FIGS. 15A to 15C are photographs showing surface conditions after gettering;

DETAILED DESCRIPTION OF THE PREFERRED EMBODIMENTS

Embodiment Mode

An embodiment mode of the present invention will be described below.

The present invention has a step of forming on an insulating surface a semiconductor film that has a crystal structure while using a metal element that accelerates crystallization, a step of forming a barrier layer on the semiconductor film that has a crystal structure, a step of forming on the barrier layer a semiconductor film that contains a rare gas element (gettering site), and a heat treatment step. The present invention is for removing or reducing the metal element from the semiconductor film that has a crystal structure by heat treatment in which the metal element contained in the semiconductor film having a crystal structure is moved through the barrier layer to be trapped in the gettering site (the semiconductor film containing a rare gas element). The heat treatment may be one using a furnace. Irradiation of intense light from a lamp light source may be employed instead. Alternatively, heat treatment and irradiation of intense light may be employed both at the same time.

One of characteristics of the present invention is to increase the gettering effect by setting the oxygen concentration in the semiconductor film that contains a rare gas element (gettering site) to $5\times10^{18}/cm^3$ or higher.

The semiconductor film that contains a rare gas element is preferably formed in an atmosphere containing a rare gas element by sputtering using a semiconductor target, or a semiconductor target that contains an impurity element (phosphorus, arsenic, boron, or the like) for giving the semiconductor one conductivity type (resistivity: 0.01 to 1000 Ωcm). For instance, the film is formed by a magnetron sputtering apparatus with an RF power supply using a silicon target that contains boron (resistivity: 10 Ω).

One of characteristics of the present invention is using an insulating film formed from a silicon nitride film with a thickness of 10 nm or less as a base insulating film that is in contact with the first semiconductor film to increase the gettering effect. The base insulating film has a blocking effect as well.

According to the present invention, after the metal element is removed, or reduced, from the semiconductor film having a crystal structure by heat treatment, the semiconductor film that contains a rare gas element and the barrier layer are removed. The thus obtained semiconductor film having a crystal structure is patterned into desired shapes to be used as an active layer of a TFT.

A brief description is given below with reference to FIGS. 1A to 1G on a process of manufacturing a typical TFT using the present invention.

Figure 1A:
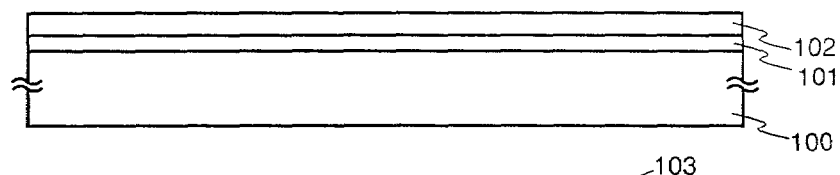
FIGS. 1A to 1G are diagrams showing an embodiment mode of the present invention.
Figure 1B:
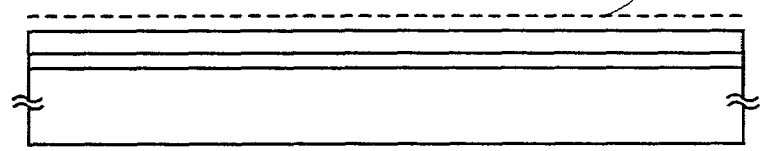

In FIG. 1A, 100 denotes a substrate having an insulating surface; 101, an insulating film that serves as a blocking layer; and 102, a semiconductor film having an amorphous structure.

The substrate 100 in FIG. 1A may be a glass substrate, a quartz substrate, a ceramic substrate, or the like. A silicon substrate, metal substrate, or stainless-steel substrate with an insulating film formed on its surface may be used instead. A plastic substrate may also be used if it has a heat resistance that can withstand the process temperature of this manufacture process.

First, as shown in FIG. 1A, an insulating film such as a silicon oxide film, a silicon nitride film, or a silicon oxynitride film ($SiO_xN_y$) is formed as the base insulating film 101 on the substrate 100. In a typical example, the base insulating film 101 has a two-layer structure consisting of a first silicon oxynitride film with a thickness of 50 to 100 nm and a second silicon oxynitride film with a thickness of 100 to 150 nm. The first silicon oxynitride film is formed using as reaction gas $SiH_4$, $NH_3$, and $N_2O$. The second silicon oxynitride film is formed using as reaction gas $SiH_4$ and $N_2O$. Preferably, one of the layers of the base insulating film 101 is a silicon nitride film (SiN film) or second silicon oxynitride film ($SiN_xO_y$ (x>y) film) with a thickness of 10 nm or less. Using a silicon nitride film for the base insulating film that is in contact with the semiconductor film is very effective since nickel tends to move into a region of high oxygen concentration during gettering. The base insulating film may have a three-layer structure consisting of a first silicon oxynitride film, a second silicon oxynitride film, and a silicon nitride film which are laminated sequentially.

Next, a first semiconductor film 102 having an amorphous structure is formed on the base insulating film. The first semiconductor film 102 is formed from a semiconductor material mainly containing silicon. Typically, an amorphous silicon film or amorphous silicon germanium film formed by plasma CVD, low pressure CVD, or sputtering to a thickness of 10 to 100 nm is used as the first semiconductor film 102. In order to obtain a semiconductor film having an excellent crystal structure through subsequent crystallization, the concentration of impurities such as oxygen and nitrogen in the first semiconductor film 102 having an amorphous structure should be reduced to $5\times10^{18}/cm^3$ (atomic concentration measured by secondary ion mass spectroscopy (SIMS)) or lower. These impurities inhibit subsequent crystallization and, after crystallization, increase the density of trap center and recombination center. Therefore it is desirable to use an ultra high vacuum CVD apparatus equipped with a mirror finished (processed by field polishing) reaction chamber and with an oil-free vacuum exhaust system, as well as to use a material gas of high purity.

A technique disclosed in Japanese Patent Application Laid-open No. Hei 8-78329 is used here to crystallize the first semiconductor film 102 having an amorphous structure. According to the technique disclosed in the publication, an amorphous silicon film is selectively doped with a metal element that accelerates crystallization and then subjected to heat treatment to form a semiconductor film having a crystal structure, with the crystallization starting from the doped regions. The metal element having a catalytic action of accelerating crystallization is nickel in this embodiment mode. A nickel acetate solution containing 1 to 100 ppm of nickel by weight is applied by a spinner to the surface of the first semiconductor film 102 having an amorphous structure to form a nickel-containing layer 103. (FIG. 1B) The nickel-containing layer 103 may be formed by other methods than application, and sputtering, evaporation, or plasma treatment may be employed to form a very thin film. Although the solution is applied to the entire surface of the first semiconductor film 102 in the example shown here, masks may be used to selectively apply the solution and form nickel-containing layers.

Figure 1C:

The first semiconductor film 102 is then subjected to heat treatment for crystallization. Crystallization proceeds with silicide, which is formed in a portion of the semiconductor film that comes into contact with the metal element for accelerating crystallization of a semiconductor, as a nucleus. A first semiconductor film 104 having a crystal structure is thus formed as shown in FIG. 1C. The concentration of oxygen contained in the first semiconductor film 104 after crystallization is desirably $5\times10^{18}/cm^3$ or lower. Here, heat treatment (at 450° C. for an hour) for dehydrogenation is followed by heat treatment (at 550 to 650° C. for 4 to 24 hours) for crystallization. If crystallization is achieved by irradiation of intense light instead of heat treatment, one or a combination of infrared light, visible light, and ultraviolet light can be employed. Typically, light emitted from a halogen lamp, a metal halide lamp, a xenon arc lamp, a carbon arc lamp, a high-pressure sodium lamp, or a high-pressure mercury lamp is used. The lamp light source is lit for 1 to 60 seconds, preferably 30 to 60 seconds, which is repeated 1 to 10 times so that the semiconductor film is heated to reach about 600 to 1000° C. in an instant. If necessary, the first semiconductor film 102 having an amorphous structure may be subjected to heat treatment for releasing hydrogen from 102 prior to the irradiation of intense light. Alternatively, the film may be crystallized by simultaneously conducting heat treatment and irradiation of intense light both. Considering the productivity, crystallization by irradiation of intense light is preferred.

The thus obtained first semiconductor film 104 has a remaining metal element (nickel, here). Though the metal element is not uniformly distributed in the film, the concentration thereof is higher than $1\times10^{19}$ atoms/$cm^3$ in average. The semiconductor film with the metal element remaining therein can form a TFT and various types of other semiconductor elements but it is preferred to remove the remaining metal element by gettering in accordance with the following method.

A naturally oxidized film on the surface of the semiconductor film is removed by diluted fluoric acid or the like. Then, preferably, the first semiconductor film 104 having a crystal structure is irradiated with laser light in order to raise the crystallization ratio (the ratio of crystal components to the entire volume of the film) and repair defects remaining in crystal grains. When the film is irradiated with laser light, a very thin oxide film (not shown in the drawing) is formed on its surface. Examples of the laser light usable include excimer laser light having a wavelength of 400 nm or less and second harmonic or third harmonic of YAG laser. A continuous wave gas or solid laser may also be used. In the usable solid laser, crystals of YAG, $YVO_4$, YLF, $YAlO_3$ or the like are doped with Cr, Nd, Er, Ho, Ce, Co, Ti, or Tm. Although it varies depending on the dopant, the fundamental wave of light emitted from the laser has a wavelength of about 1 μm. Harmonic is obtained from the fundamental wave using a non-linear optical element. Pulse laser light with a repetition frequency of about 10 to 1000 Hz is used here. The laser light is collected by an optical system into a beam of 100 to 400 mJ/$cm^3$, and the crystalline semiconductor film may be irradiated with the laser beam at an overlap ratio of 90 to 95%. The laser light may be replaced by intense light. Alternatively, laser light and intense light may be used simultaneously to irradiate the semiconductor film.

When a continuous wave solid laser is used, laser light emitted from a 10 W power continuous wave YVO$_4$ laser is converted into harmonic by a non-linear optical element. Instead, YVO$_4$ crystals and the non-linear optical element may be put in a resonator to emit harmonic. Then the harmonic is formed into rectangular or elliptical laser light on the irradiation surface preferably by an optical system to irradiate the irradiation object. The energy density required at this point is about 0.01 to 100 MW/cm$^2$ (preferably 0.1 to 10 MW/cm$^2$). The semiconductor film is relatively moved with respect to the laser light at a rate of about 0.5 to 2000 cm/s during the irradiation.

The oxide film formed by the above laser light irradiation after crystallization is insufficient by itself. Therefore an oxide film (called chemical oxide) is formed from an aqueous solution containing ozone (typically, ozone water) to form a barrier layer 105 using the oxide film with a total thickness of 1 to 10 nm. A second semiconductor film 106 containing a rare gas element is formed on the barrier layer 105. (FIG. 1D) The oxide film formed by irradiating the first semiconductor film 104 having a crystal structure with laser light is a part of the barrier layer here. The barrier layer 105 functions as an etching stopper when the second semiconductor film 106 alone is selectively removed in a later step. The aqueous solution containing ozone may be replaced by an aqueous solution in which a hydrogen peroxide solution is mixed with sulfuric acid, hydrochloric acid, or nitric acid to treat the surface and form a chemical oxide similarly. Alternatively, the barrier layer 105 may be formed by generating ozone through ultraviolet irradiation in an oxygen atmosphere to oxidize the surface of the semiconductor film having a crystal structure. An oxide film formed by plasma CVD, sputtering, or evaporation to a thickness of about 1 to 10 nm may also be deposited for use in the barrier layer. Another method that can be used to form the barrier layer 105 is to form a thin oxide film by heating in a clean oven at approximately 200 to 350° C. The barrier layer 105 obtained by one or a combination of the above methods has to have a film quality or film thickness that allows nickel in the first semiconductor film to move into the second semiconductor film during later gettering.

The second semiconductor film 106 containing a rare gas element is formed by sputtering here to serve as a gettering site. One or more kinds of elements selected from the group consisting of helium (He), neon (Ne), argon (Ar), krypton (Kr), and xenon (Xe) are used as the rare gas element. Argon (Ar) is particularly preferable because of its inexpensiveness. The second semiconductor film here is formed using a silicon target in an atmosphere containing a rare gas element. There are two reasons for injecting ions of rare gas element that is inert gas into the semiconductor film. One is to form dangling bonds so that the semiconductor film is distorted. The other is to give strain to lattice cells of the semiconductor film. Giving strain to lattice cells of the semiconductor film is achieved markedly well when an element that is larger in atom radius than silicon, such as argon (Ar), krypton (Kr), or xenon (Xe), is used. When the semiconductor film contains a rare gas element, lattice strain and dangling bonds are both formed to enhance gettering action.

FIG. 12 shows results of measuring the Ar concentration in 0.2 μm thick films respectively formed in order at a pressure of 0.2 Pa, 0.4 Pa, 0.6 Pa, 0.8 Pa, 1.0 Pa, and 1.2 Pa. Film formation conditions other than the pressure are the same for all of the films and include using a B dope silicon target (resistivity: about 10 Ωcm, target size (diameter): 30.5 cm), and setting the gas (Ar) flow rate to 50 sccm, the film formation power to 3 kW, and the substrate temperature to 150° C.

The results in FIG. 12 show that lower film formation pressure makes a higher Ar concentration film, namely, a better film as a gettering site. This is because, when the film formation pressure in sputtering is low, the probability is small for collision between Ar gas and recoil atoms (Ar atoms reflected at the target surface) in the reaction chamber, making it easier for the recoil atoms to enter the substrate. The conclusion led from the above experiment results is that, when a sputtering device with an RF power supply is used at a film formation pressure of 0.2 to 1.0 Pa shown in FIG. 12 are employed properly, a semiconductor film which contains a rare gas element in a concentration of $1\times10^{19}$ to $1\times10^{22}$/cm$^3$, desirably $1\times10^{20}$ to $1\times10^{21}$/cm$^3$, more desirably $5\times10^{20}$/cm$^3$, and which provides the gettering effect can be formed by sputtering.

Figure 13:
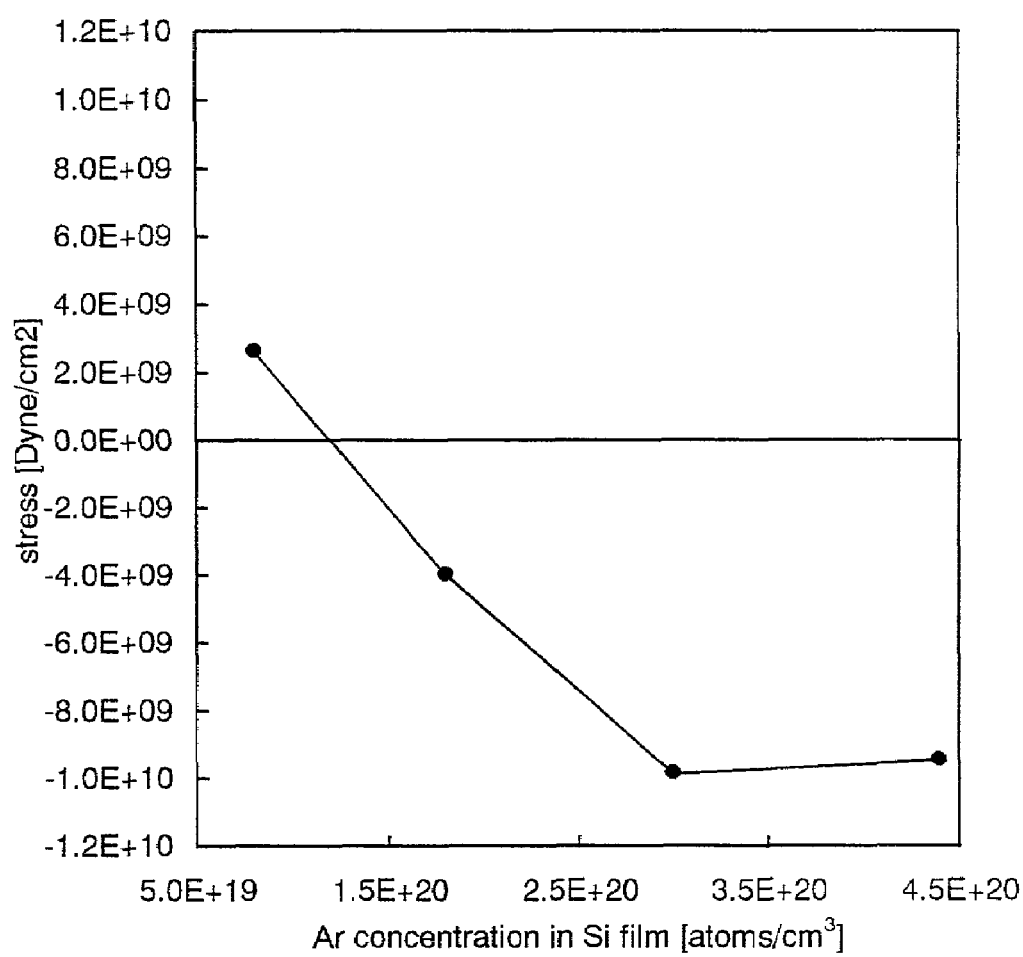
FIG. 13 is a graph showing the relation between the internal stress in a gettering site and the Ar concentration.

FIG. 13 shows the relation between the Ar concentration and the internal stress of the second semiconductor film. According to FIG. 13, the compressive stress is higher when the Ar concentration in the film is higher. For instance, an amorphous silicon film formed by sputtering at a film formation pressure of 0.2 Pa contains Ar in an atomic concentration of $3\times10^{20}$/cm$^3$, and exhibits compressive stress (about $-9.47\times10^9$ dynes/cm$^2$). Therefore, it is desirable to adjust the stress of the film by setting the Ar concentration so as to avoid peeling of the film in later heat treatment.

In general, internal stress is classified into tensile stress and compressive stress. When a thin film contracts on a substrate, the substrate pulls in a direction that prevents the contraction and curls while trapping the thin film inside. This is called tensile stress. On the other hand, when a thin film stretches over a substrate, the substrate is pressed and curls inside the thin film. This is called compressive stress.

The relation between the rare gas element (Ar) concentration in an amorphous silicon film formed by sputtering and the RF power (or RF power density) is obtained. Experiment procedures thereof are shown below.

An amorphous silicon film containing a rare gas element is formed on a glass substrate by a sputtering apparatus using an RF power supply. A silicon target (resistivity: 10 Ωcm) is employed, the frequency is set to 1 kHz to 30 MHz, preferably 10 to 20 MHz, and Ar is supplied to a film formation chamber at a flow rate of 50 sccm. The film formation pressure is set to 0.1 to 5 Pa, here, 0.4 Pa, and the substrate temperature is set to 300° C. or lower, here 150° C. Each layer of the laminate has a thickness of 0.2 μm and the RF power is set differently for different layers. The electrode is 30.5 cm in diameter. The RF power density is calculated by dividing RF power by the surface area of the electrode. Films each having a thickness of 0.2 μm are layered on a glass substrate while setting the RF power to 0.4 kW for the first layer, 0.5 kW for the second layer, 1 kW for the third layer, and 3 kW for the fourth layer. The atomic concentration of Ar in the films formed is measured by secondary ion mass spectroscopy (SIMS).

Figure 28:
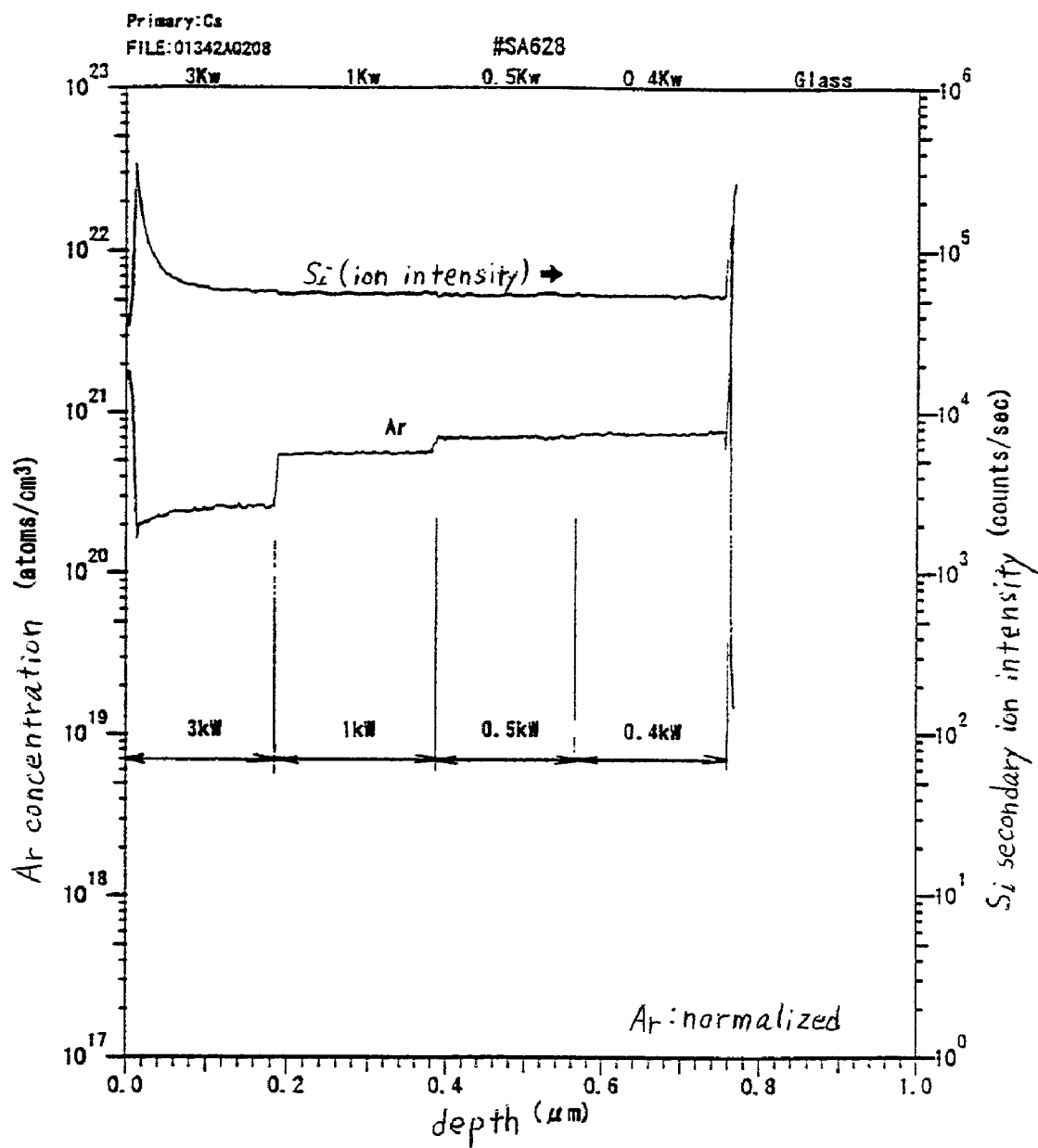
FIG. 28 is a graph of SIMS data (RF power dependency) showing the Ar concentration in a silicon film formed by sputtering (RF method).

Results obtained are shown in FIG. 28. In FIG. 28, the axis of ordinate indicates the atomic concentration of Ar and the axis of abscissa indicates the depth from the surface of the sample. FIG. 28 also shows the ion intensity of silicon with its axis of ordinate indicating the secondary ion intensity and its axis of abscissa indicating the depth from the surface of the sample.

The results in FIG. 28 show that lower RF power (or RF power density) makes a higher Ar atomic concentration film, namely, a better film as a gettering site. Low RF power (or RF power density) also leads to small internal stress, thereby preventing the film from peeling off.

From these experiment results, it is concluded that a preferable gettering site (amorphous silicon film containing a rare gas element) is obtained by setting the film formation pressure and the RF power (or RF power density) appropriately.

If the second semiconductor film is formed using a target containing phosphorus that is an impurity element of one conductivity type, gettering by Coulomb force of phosphorus is available in addition to gettering by a rare gas element.

Since nickel tends to move into a region of high oxygen concentration during gettering, the oxygen concentration in the second semiconductor film 106 is desirably set higher than the oxygen concentration in the first semiconductor film, for example, $5 \times 10^{18}/cm^3$ or higher.

Figure 1D:
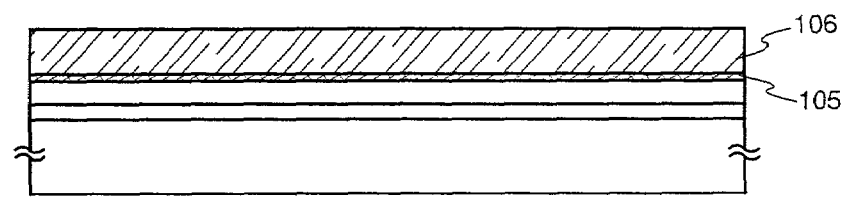
Figure 1E:
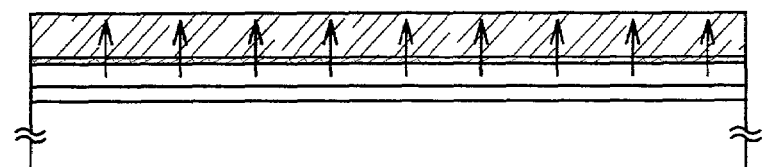
Figure 1F:
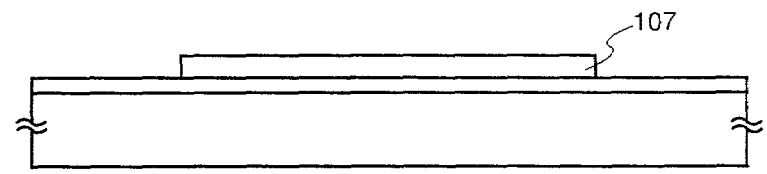

If the first semiconductor film too is doped with a rare gas element in the film formation by sputtering in FIG. 1D, the doped region of the first semiconductor film undesirably serves as a gettering site and thereby reduces the gettering effect. The sputtering conditions therefore should be adjusted so as not to dope the first semiconductor film with a rare gas element. The barrier layer works to prevent the first semiconductor film from being doped with a rare gas element during the film formation by sputtering and therefore the film quality and film thickness of the barrier layer have to be controlled carefully. According to experiments conducted by the present inventors, a preferable barrier layer is a laminate of two oxide films with a thickness of 10 nm or less in total. One of the oxide films is formed by laser light irradiation for raising the crystallization ratio and for repairing defects remaining in crystal grains. The other oxide film is formed from an aqueous solution containing ozone. If the barrier layer is a single layer of oxide film that is formed from an aqueous solution containing ozone after removing an oxide film that is formed by laser light irradiation, the first semiconductor film is doped with a minute amount of rare gas element during the film formation by sputtering and therefore this barrier layer is insufficient.

Next, heat treatment is conducted for gettering to reduce the concentration of the metal element (nickel) in the first semiconductor film, or to completely remove the metal element from there. (FIG. 1E) The heat treatment for gettering is irradiation of intense light or application of heat. Through the gettering, the metal element moves in the direction indicated by the arrows in FIG. 1E (namely, toward the surface of the second semiconductor film from the substrate side) and the metal element contained in the first semiconductor film 104 that is covered with the barrier layer 105 is removed, or the concentration of the metal element in the first semiconductor film is reduced. The distance the metal element moves during gettering may at least correspond to the thickness of the first semiconductor film, and therefore gettering can be completed in a relatively short period of time. Here, most of nickel is moved to the second semiconductor film 106 so that it is not segregated in the first semiconductor film 104. As a result, the first semiconductor film 104 has almost no nickel left. The gettering has to be through so that the nickel concentration in the first semiconductor film is reduced to $1 \times 10^{18}/cm^3$ or lower, desirably $1 \times 10^{17}/cm^3$ or lower.

Depending on conditions of the heat treatment for gettering, or the thickness of the second semiconductor film, the second semiconductor film may be partially crystallized. If the second semiconductor film is crystallized, dangling bonds and lattice strain are reduced to lower the gettering effect. Therefore it is preferable to set conditions of the heat treatment or the thickness of the second semiconductor film so as not to crystallize the second semiconductor film. Nevertheless, the second semiconductor film, i.e., an amorphous silicon film containing a rare gas element is optimum as a gettering site because it is difficult to crystallize compared to an amorphous silicon film that does not contain a rare gas element.

By adjusting the conditions of the heat treatment for gettering, it is possible to raise the crystallization ratio of the first semiconductor film and repair defects remaining in the crystal grains, in other words, to improve the crystallinity, at the same time as gettering.

In this specification, the term gettering refers to a metal element in a to-be-gettered region (the first semiconductor film, here) being released by thermal energy and moved to a gettering site by diffusion. Accordingly, gettering is dependent on the process temperature and gettering progresses in a shorter period of time at a higher temperature.

If irradiation of intense light is used for gettering, a lamp light source for heating is lit for 1 to 60 seconds, preferably 30 to 60 seconds, which is repeated 1 to 10 times, preferably 2 to 6 times. The intensity of light emitted from the lamp light source can be set arbitrarily, as long as the semiconductor film is heated to reach about 600 to 1000° C., preferably about 700 to 750° C., in an instant.

Figure 14:
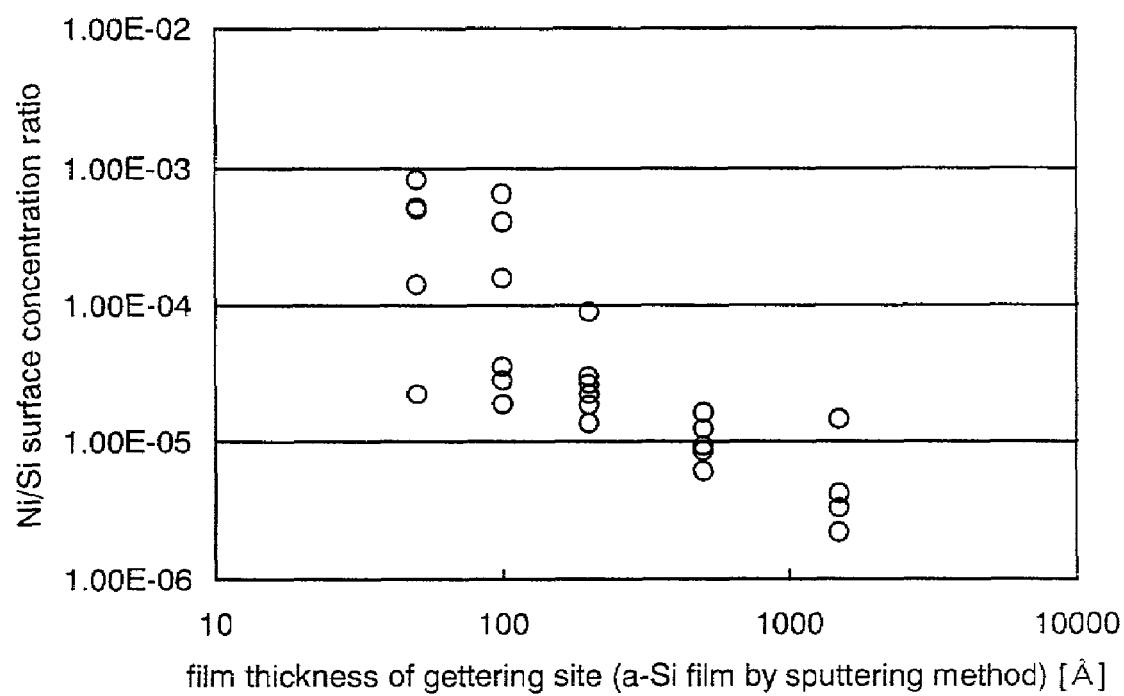
FIG. 14 is a graph showing the film thickness dependency of a gettering site.

FIG. 14 shows the relation between the thickness of the gettering site, namely, the second semiconductor film and the nickel/silicon concentration ratio on the surface. The nickel/silicon concentration ratio is obtained by measuring the nickel concentration and silicon concentration on the surface by TXRF (total reflection X-ray fluorescence) and then calculating the ratio of the nickel concentration to the silicon concentration. FIG. 14 shows that, when the second semiconductor film is 50 nm or less in thickness, fluctuation is large and there are portions on the surface where the nickel concentration is high with respect to the silicon concentration. Therefore the thickness of the second semiconductor film is desirably at least 50 nm or more, at least, while the first semiconductor film has a thickness of 50 nm. The upper limit is not particularly set for the thickness of the second semiconductor film. However it should be taken into consideration that time required for forming the second semiconductor film and time required for removing the second semiconductor film after gettering are prolonged as the second semiconductor film becomes thicker.

When heat treatment is chosen for gettering, the substrate is heated in a nitrogen atmosphere at 450 to 800° C. for 1 to 24 hours, for example, at 550° C. for 14 hours. Alternatively, heat treatment and irradiation of intense light both may be employed for gettering.

The second semiconductor film 106 alone is selectively removed using the barrier layer 105 as an etching stopper. Then the barrier layer 105 is removed to pattern the first semiconductor film 104 by a known patterning technique. As a result, a semiconductor film 107 having desired shape is obtained. (FIG. 1F) The selective etching for removing the second semiconductor film alone is achieved by dry etching by $ClF_3$ without using plasma, or wet etching using hydrazine or an alkaline solution such as an aqueous solution that contains tetraethyl ammonium hydroxide (chemical formula: $(CH_3)_4NOH$). A high concentration of nickel is detected by TXRF on the surface of the barrier layer after the second semiconductor film is removed. Therefore it is preferable to remove the barrier layer using an etchant that contains fluoric acid. Desirably, a thin oxide film is formed from ozone water on the surface after the barrier layer is removed and before a resist mask is formed.

After the surface of the semiconductor layer is washed by an etchant that contains fluoric acid, an insulating film mainly containing silicon is formed to serve as a gate insulating film 108. The surface washing and formation of the gate insulating film are desirably conducted successively without exposing the substrate to the air.

The surface of the gate insulating film 108 is washed and then a gate electrode 109 is formed. Next, the semiconductor layer is appropriately doped with an impurity element that gives a semiconductor the n type conductivity (such as P or As), phosphorus here, to form a source region 110 and a drain region 111. After doping, the impurity element is activated by heat treatment, irradiation of intense light, or laser light irradiation. At the same time the impurity element is activated, recovery is made from plasma damage given to the gate insulating film or plasma damage given to the interface between the gate insulating film and the semiconductor layer. It is particularly effective to activate the impurity element by irradiating the front side or back side with second harmonic of YAG laser in an atmosphere of a temperature ranging between room temperature and 300° C. A YAG laser requires less maintenance and therefore is a preferred activation means.

Subsequent steps include formation of an interlayer insulating film 113, hydrogenation, formation of contact holes that reach the source region and the drain region, and formation of a source electrode 114 and a drain electrode 115. A TFT (n-channel TFT) is thus completed. (FIG. 1G).

The concentration of the metal element contained in a channel formation region 112 of the thus obtained TFT is lower than $1\times10^{17}/cm^3$.

Figure 1G:
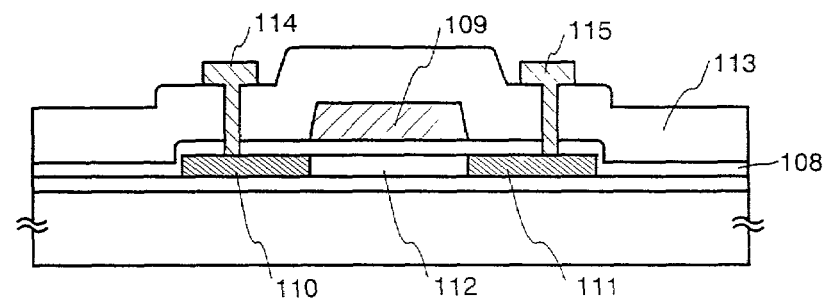

The present invention is not limited to the TFT structure of FIG. 1G. If necessary, the TFT may have a lightly doped drain (LDD) structure in which an LDD region is formed between the channel formation region and the drain region (or the source region). In the LDD structure, a region lightly doped with an impurity element is placed between a channel formation region and a source region or drain region heavily doped with an impurity element, and the region is called an LDD region. Instead, the TFT may have a GOLD (gate-drain overlapped LDD) structure in which an LDD region overlaps a gate electrode with a gate insulating film interposed therebetween.

Although the description here takes an n-channel TFT as an example, the method is capable of forming a p-channel TFT when a p type impurity element is used instead of the n type impurity element.

The TFT in the example given here is a top gate TFT. However, the present invention can be applied to a TFT of any structure. For example, the present invention is applicable to a bottom gate TFT (reverse stagger TFT) and a forward stagger TFT.

The present invention structured as above will further be described in detail in the following Embodiments.

Embodiment 1

An embodiment of the present invention will be described with reference to FIGS. 2A to 4. Here a detailed description is given on a method of simultaneously forming on the same substrate a TFT for a pixel portion and TFTs (an n-channel TFT and a p-channel TFT) for driving circuits that are placed in the periphery of the pixel portion.

First, a base insulating film 1101 is formed on a glass substrate 1100 and a first semiconductor film having a crystal structure is formed in the manner described in Embodiment Mode. Then the semiconductor film is etched into desired shapes to form semiconductor layers 1102 to 1106 that are separated from one another like islands.

For detailed explanation on the process up through formation of the semiconductor layers 1102 to 1106, see Embodiment Mode. What follows is an abbreviated version thereof.

The base insulating film 1101 formed on the glass substrate in this embodiment has a two-layer structure. However, the base insulating film may be a single layer or three or more layers of insulating films. The first layer of the base insulating film 1101 is a first silicon oxynitride film (composition ratio: Si=32%, O=27%, N=24%, H=17%) formed to a thickness of 50 nm by plasma CVD using as reaction gas $SiH_4$, $NH_3$, and $N_2O$. The second layer of the base insulating film 1101 is a second silicon oxynitride film (composition ratio: Si=32%, O=59%, N=7%, H=2%) formed to a thickness of 100 nm by plasma CVD using as reaction gas $SiH_4$ and $N_2O$.

Next, an amorphous silicon film is formed on the base insulating film 1101 to a thickness of 50 nm by plasma CVD. Then a nickel acetate solution containing 10 ppm of nickel by weight is applied by a spinner to the semiconductor film. Instead of application, sputtering may be used to spray nickel elements to the entire surface. A multi-task type lamp annealing apparatus with 21 tungsten halogen lamps in total is used for irradiation of intense light at 700° C. for 110 seconds to obtain a silicon film having a crystal structure. Heating by the lamp annealing apparatus at 700° C. or lower heats the semiconductor film instantly but the substrate 1100 is hardly deformed.

Next, the semiconductor film is irradiated with laser light (XeCl: wavelength, 308 nm) to raise the crystallization ratio and repair defects remaining in the crystal grains. The laser light used is excimer laser light having a wavelength of 400 nm or less, or second harmonic or third harmonic of YAG laser. In either case, pulse laser light with a repetition frequency of about 10 to 1000 Hz is collected by an optical system into a beam of 100 to 400 $mJ/cm^2$, and the beam irradiates the surface of the silicon film by scanning it at an overlap ratio of 90 to 95%. Laser light irradiation at this point is very important because it is used to form an oxide film to prevent doping of the silicon film having a crystal structure with a rare gas element in later film formation by sputtering and because it enhances the gettering effect. The oxide film formed by this laser light irradiation and an oxide film formed by treating the surface with ozone water for 120 seconds together make a barrier layer that has a thickness of 1 to 5 nm in total.

On the barrier layer, an amorphous silicon film containing argon elements is formed to a thickness of 150 nm by sputtering to serve as a gettering site. Film formation conditions by sputtering in this embodiment include setting the film formation pressure to 0.3 Pa, the gas (Ar) flow rate to 50 sccm, the film formation power to 3 kW, and the substrate temperature to 150° C. The amorphous silicon film that is formed under the above conditions contains argon elements in an atomic concentration of $3\times10^{20}$ to $6\times10^{20}/cm^3$, and contains oxygen in an atomic concentration of $1\times10^{19}$ to $3\times10^{19}/cm^3$. Thereafter, a lamp annealing apparatus is used in heat treatment at 650° C. for 3 minutes for gettering.

With the barrier layer as an etching stopper, the amorphous silicon film containing argon elements, which is a gettering site, is selectively removed. The barrier layer is then selectively removed using diluted fluoric acid. It is desirable to remove the barrier layer that is composed of oxide films after gettering since nickel tends to move into a region of high oxygen concentration during gettering.

Next, a thin oxide film is formed from ozone water on the surface of the obtained silicon film having a crystal structure (also called a polysilicon film). A resist mask is formed for etching to obtain semiconductor layers having desired shapes and separated from one another like islands. After the semiconductor layers are obtained, the resist mask is removed.

Also, after forming a semiconductor layer, in order to control the threshold (Vth) of the TFTs, the semiconductor layers may be doped with an impurity element that gives the p type or n type conductivity. Impurity elements known to give a semiconductor the p type conductivity are Group 13 elements in the periodic table, such as boron (B), aluminum (Al), and gallium (Ga). Impurity elements known to give a semiconductor the n type conductivity are Group 15 elements in the periodic table, such as phosphorus (P) and arsenic (As).

An etchant containing fluoric acid is used to remove the oxide film and wash the surface of the silicon film at the same time. Then an insulating film mainly containing silicon is formed to serve as a gate insulating film 1107. The gate insulating film in this embodiment is a silicon oxynitride film (composition ratio: Si=32%, O=59%, N=7%, H=2%) formed by plasma CVD to a thickness of 115 nm.

As shown in FIG. 2A, a first conductive film 1108a with a thickness of 20 to 100 nm, a second conductive film 1108b with a thickness of 100 to 400 nm, and a third conductive film 1108c with a thickness of 20 to 100 nm are layered on the gate insulating film 1107. In this embodiment, a 50 nm thick tungsten film, a 500 nm thick Al—Ti (alloy of aluminum and titanium) film, and a 30 nm thick titanium film are layered on the gate insulating film 1107 in the order stated.

Conductive materials for forming the first to third conductive films are elements selected from the group consisting of Ta, W, Ti, Mo, Al, and Cu, or alloy or compound materials mainly containing the elements above. Alternatively, the first to third conductive films may be polycrystalline silicon films or other semiconductor films doped with an impurity element such as phosphorus. For instance, the first conductive film may be a tungsten nitride film instead of the tungsten film, the second conductive film may be a Al—Si (alloy of aluminum and silicon) film instead of the Al—Ti (alloy of aluminum and titanium) film, and the third conductive film may be a titanium nitride film instead of the titanium film. It is not always necessarily be three layers of conductive films but two layers of conductive films, a tantalum nitride film and a tungsten film, for example, may be employed.

Preferably, W film is to be used as the first conductive layer because of its low resistivity, Al film containing 2 wt % of Si (Al—Si) which has a high heat resistance is to be used as the second conductive film, and Ti film is to be used as the third conductive layer. Furthermore, it is preferable to improve the heat resistance of the second conductive layer. But, if the Ti film is used as the third conductive layer, Ti/Al—Si will be alloyed at its interface when processed at 350° C. or more in later steps (thermal activation step etc.). As a result, the Ti/Al—Si film may have high resistivity. Therefore, TiN film is preferably used as the third conductive layer if 350° C. or more temperature is needed in the later steps. Also, TiN film may be used as the third conductive layer and Ti film may be used as a fourth conductive layer if a laser light is irradiated (laser activation step etc.) in a later step because a nitride film is easy to absorb the laser light and an irradiation surface might be damaged.

As shown in FIG. 2B, resist masks 1110 to 1115 are formed by light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

No limitation is put on selection of etching gas but $BCl_3$, $Cl_2$, and $O_2$ are suitable here. The gas flow rate thereof is set to 65:10:5 (unit:sccm), and an RF (13.56 MHz) power of 450 W is given to a coiled electrode at a pressure of 1.2 Pa to generate plasma for 117 second etching. The substrate side (sample stage) also receives an RF (13.56 MHz) power of 300 W to apply substantially negative self-bias voltage. Under the first etching conditions, the Al film and the Ti film are etched to taper second and third conductive layers around the edges.

Switching to the second etching conditions, the etching gas is changed to $CF_4$, $Cl_2$, and $O_2$. The gas flow rate thereof is set to 25:25:10 (unit:sccm), and an RF (13.56 MHz) power of 500 W is given to a coiled electrode at a pressure of 1 Pa to generate plasma, performing the etching for about 30 seconds. The substrate side (sample stage) also receives an RF (13.56 MHz) power of 20 W to apply substantially negative self-bias voltage. Under the second etching conditions using a mixture gas of $CF_4$ and $Cl_2$, the Al film, the Ti film, and the W film are etched to about the same degree. In order to etch the films without leaving any residue on the gate insulating film, the etching time is prolonged by approximately 10 to 20%.

In the first etching treatment, the first conductive layers, second conductive layers, and third conductive layers are tapered around the edges by forming the resist masks into proper shapes and by the effect of the bias voltage applied to the substrate. The angle of the tapered portions is 15 to 45°. First shape conductive layers 1117 to 1122 are thus formed from the first conductive layers, the second conductive layers, and the third conductive layers through the first etching treatment (the first shape conductive layer 1117 is composed of a first conductive layer 1117a, a second conductive layer 1117b, and a third conductive layer 1117c, 1118 is composed of 1118a, 1118b, and 1118c, and so forth). Denoted by 1116 is a gate insulating film and regions thereof that are not covered with the first shape conductive layers 1117 to 1122 are etched and thinned by about 20 to 50 nm.

Without removing the resist masks 1110 to 1115, second etching treatment is conducted next as shown in FIG. 2C. $BCl_3$ and $Cl_2$ are used as etching gas, the gas flow rate thereof is set to 20:60 (unit:sccm), and an RF (13.56 MHz) power of 600 W is given to a coiled electrode at a pressure of 1.2 Pa to generate plasma for the etching. The substrate side (sample stage) also receives an RF (13.56 MHz) power of 100 W. Under these third etching conditions, the second conductive layers and the third conductive layers are etched. The aluminum film containing a minute amount of titanium and the titanium film are thus subjected to anisotropic etching under the third etching conditions to form second shape conductive layers 1124 to 1129 (first conductive layers 1124a to 1129a, second conductive layers 1124b to 1129b, third conductive layers 1124c to 1129c). Denoted by 1123 is a gate insulating film and regions thereof that are not covered with the second shape conductive layers 1124 to 1129 are etched and thinned slightly. The tapered portions of the first conductive layers have the same length in FIGS. 2B and 2C. However, the actual length varies between the tapered portions of the first conductive layers depending on the wiring line width.

Further, the first etching treatment (the first etching condition and the second etching condition) and the second etching treatment may be continuously conducted without being exposed to the air. Also, after the etching treatment, a substrate may be taken out from a chamber to exhaust a reactive gas, and then the substrate is again put into the chamber, so that an etching at a different condition may be conducted.

Without removing the resist masks, the first doping treatment is conducted to dope the semiconductor layers with an impurity element that gives the n type conductivity. The doping treatment employs ion doping or ion implantation. In ion doping, the dose is set to $1.5 \times 10^{14}$ atoms/cm$^2$ and the acceleration voltage is set to 60 to 100 keV. Typically, phosphorus (P) or arsenic (As) is used as an impurity element that gives the n type conductivity. In this case, the second shape conductive layers 1124 to 1128 serve as masks against the impurity element that gives the n type conductivity and first impurity regions 1130 to 1134 are formed in a self-aligning manner. The first impurity regions 1130 to 1134 are each doped with the impurity element that gives the n type conductivity in a concentration of $1 \times 10^{16}$ to $1 \times 10^{17}$/cm$^3$.

Although the first doping treatment is conducted without removing the resist masks in this embodiment, the resist mask may be removed before the first doping treatment.

After the resist masks are removed, resist masks 1135 and 1136 are formed as shown in FIG. 3A for second doping treatment. The mask 1135 is for protecting a channel formation region and its surrounding regions in the semiconductor layer that forms one of n-channel TFTs of the driving circuit. The mask 1136 is for protecting a channel formation region and its surrounding regions in the semiconductor layer that forms a TFT of the pixel portion. In FIG. 3A, the tapered portions of the first conductive layers have the same length for conveniences' sake. However, the actual length varies between the tapered portions of the first conductive layers depending on the wiring line width. Accordingly, when a plurality of wiring lines having different wiring line widths are formed on the same substrate, regions doped also have different widths.

The second doping treatment employs ion doping to dope the semiconductor layers with phosphorus (P) setting the dose to $1.5 \times 10^{15}$ atoms/cm$^2$ and the acceleration voltage to 60 to 100 keV. Here, impurity regions are formed in the semiconductor layers utilizing the difference in thickness of the second shape conductive layers 1124 to 1128 and the gate insulating film 1123. The regions covered with the masks 1135 and 1136 are not doped with phosphorus (P). Second impurity regions 1180 to 1182 and third impurity regions 1137 to 1141 are thus formed. The third impurity regions 1137 to 1141 are doped with an impurity element that gives the n type conductivity in a concentration of $1 \times 10^{20}$ to $1 \times 10^{21}$/cm$^3$. The second impurity regions are doped with the impurity element that gives the n type conductivity in a concentration lower than in the third impurity regions due to the difference in thickness of the gate insulating film. The concentration of the impurity element in the second impurity regions is $1 \times 10^{18}$ to $1 \times 10^{19}$/cm$^3$.

After the resist masks 1135 and 1136 are removed, resist masks 1142 to 1144 are newly formed as shown in FIG. 3B for the third doping treatment. Through the third doping treatment, a fourth impurity region 1147 and fifth impurity regions 1145 and 1146 are formed in the semiconductor layer for forming the p-channel TFT. The fourth and fifth impurity regions are doped with an impurity element that gives the p type conductivity. The fourth impurity region is formed in a region that overlaps one of the second shape conductive layers and is doped with an impurity element that gives the p type conductivity in a concentration of $1 \times 10^{18}$ to $1 \times 10^{20}$/cm$^3$. The fifth impurity regions 1145 and 1146 are doped with an impurity element that gives the p type conductivity in a concentration of $1 \times 10^{20}$ to $1 \times 10^{21}$/cm$^3$. The fifth impurity region 1146 is doped with phosphorus (P) in the previous step. However, through the third doping treatment, the region 1146 is doped with an impurity element that gives the ptype conductivity in a concentration 1.5 to 3 times higher than the phosphorus concentration and therefore has the p type conductivity.

Fifth impurity regions 1148 and 1149 and a fourth impurity region 1150 are formed in the semiconductor layer for forming a storage capacitor in a pixel portion.

Through the above steps, the impurity regions having the n type or p type conductivity are formed in the semiconductor layers. The second shape conductive layers 1124 to 1127 serve as gate electrodes. The second shape conductive layer 1128 serves as one of electrodes constituting the storage capacitor in the pixel portion. The second shape conductive layer 1129 forms a source wiring line in the pixel portion.

The order of etching and doping steps is not particularly limited to the order given in the above and may be changed as long as the conductive layers 1124 to 1127 and the impurity regions (the first to fifth impurity regions) are obtained.

Next, an insulating film (not shown in the drawing) is formed to cover the surface almost completely. The insulating film in this embodiment is a silicon oxynitride film formed by plasma CVD to a thickness of 50 nm. The insulating film is not limited to the silicon oxynitride film and a single layer or a laminate of other insulating films that contains silicon may be used instead.

The next step is activation of the impurity elements used in doping of the semiconductor layers. The activation step is achieved by rapid thermal annealing (RTA) using a lamp light source, back side irradiation with a YAG laser or an excimer laser, or heat treatment using a furnace, or a combination of these methods. Since a material mainly containing aluminum is used in the second conductive layers in this embodiment, heating conditions in the activation step has to be set taking into consideration the heat resistance of the second conductive layers.

During the activation treatment, gettering is simultaneously achieved in the third impurity regions 1137, 1139, and 1140 and the fifth impurity regions 1146 and 1149 that contain high concentration of phosphorus. Through the gettering, nickel used as a catalyst in crystallization is moved into these high phosphorus concentration regions and the nickel concentration is reduced in the semiconductor layers for mainly forming channel formation regions. The channel formation regions with reduced nickel concentration lower the OFF current value and improve the crystallinity in TFTs, and therefore provide high field effect mobility and excellent characteristics. In this embodiment, gettering has already been conducted once in accordance with the method shown in Embodiment Mode when the semiconductor layers are formed, making this gettering with phosphorus the second time gettering. If the first time gettering is through, the second time gettering is not particularly necessary.

Although the insulating film is formed before the activation in the example shown in this embodiment, the insulating film may be formed after the activation.

Next, a silicon nitride film is formed as a first interlayer insulating film 1151 and heat treatment (at 300 to 550° C. for 1 to 12 hours) is performed on the first interlayer insulating film to hydrogenate the semiconductor layers. (FIG. 3C) This step is for terminating dangling bonds in the semiconductor layers using hydrogen contained in the first interlayer insulating film 1151. Irrespective of the presence or absence of the insulating film that is a silicon oxide film (not shown), the semiconductor layers can be hydrogenated. However, heating conditions in the hydrogenation step has to be set taking into consideration the heat resistance of the second conductive layers since a material mainly containing aluminum is used in the second conductive layers in this embodiment. Other hydrogenation measures employable include plasma hydrogenation (which uses hydrogen excited by plasma).

On the first interlayer insulating film 1151, a second interlayer insulating film 1152 is formed from an organic insulating material. In this embodiment, a plurality of etching processes are sequentially conducted. In this embodiment, an acrylic resin film with a thickness of 1.6 μm is used. A contact hole reaching the source wiring line 1129 and contact holes reaching other impurity regions are formed next. In this embodiment, the contact holes are formed by etching the second interlayer insulating film with the first interlayer insulating film as an etching stopper, then etching the first interlayer insulating film with the insulating film (not shown) as an etching stopper, and then etching the insulating film (not shown).

Thereafter, wiring lines and a pixel electrode are formed from Al, Ti, Mo, W, or the like. Materials for the electrodes and pixel electrode are, desirably, highly reflective materials such as a film mainly containing Al or Ag, or a laminate of a film mainly containing Al and a film mainly containing Ag. Thus formed are source or drain wiring lines 1153 to 1158, a gate wiring line 1160, a connection wiring line 1159, and a pixel electrode 1161.

A driving circuit 406 that has an n-channel TFT 401, a p-channel TFT 402, and an n-channel TFT 403 and a pixel portion 407 that has an n-channel TFT 404 and a storage capacitor 405 are formed on the same substrate by the method described above. Such a substrate is called in this specification as an active matrix substrate for conveniences' sake.

The n-channel TFT 401 (second n-channel TFT) of the driving circuit 406 has a channel formation region 1162, a second impurity region 1163 partially overlapping the second shape conductive layer 1124 that serves as a gate electrode, and a third impurity region 1164 that functions as a source region or a drain region. The p-channel TFT 402 has a channel formation region 1165, a fourth impurity region 1166 partially overlapping the second shape conductive layer 1125 that serves as a gate electrode, and a fourth impurity region 1167 that functions as a source region or a drain region. The n-channel TFT 403 (second n-channel TFT) has a channel formation region 1168, a second impurity region 1169 partially overlapping the second shape conductive layer 1126 that serves as a gate electrode, and a third impurity region 1170 that functions as a source region or a drain region. The n-channel TFTs and the p-channel TFT can be used to form a shift register circuit, a buffer circuit, a level shifter circuit, a latch circuit, and the like. The structure of the n-channel TFT 401 or 403 is suitable especially for a buffer circuit that is high in driving voltage because the structure can prevent degradation by hot carrier effect.

The pixel TFT 404 (first n-channel TFT) of the pixel portion 407 has a channel formation region 1171, a first impurity region 1172 formed outside of the second shape conductive layer 1127 that serves as a gate electrode, and a third impurity region 1173 that functions as a source region or a drain region. A fourth impurity region 1176 and a fifth impurity region 1177 are formed in the semiconductor layer that functions as one of the electrodes of the storage capacitor 405. The storage capacitor 405 is composed of the second shape electrode 1129 and the semiconductor layer 1106 with an insulating film (the same film as the gate insulating film) as dielectric.

If the pixel electrode is formed from a transparent conductive film using one more photo mask, a transmissive display device is obtained.

Embodiment 2

The gate electrodes have a three-layer structure in the example shown in Embodiment 1. In this embodiment, gate electrodes have a two-layer structure. This embodiment is identical with Embodiment 1 except the gate electrodes. Accordingly, only the difference is described.

In this embodiment, a TaN film with a thickness of 30 nm is formed as a first conductive film and a W film with a thickness of 370 nm is layered thereon as a second conductive film. The TaN film is formed by sputtering using a Ta target in an atmosphere containing nitrogen. The W films are formed by sputtering using a W target.

As in Embodiment 1, this embodiment employs ICP etching and etches the films into desired taper shapes by adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

Similar to Embodiment 1, the first etching treatment in this embodiment uses first and second etching conditions. The first etching conditions include using as etching gas $CF_4$, $Cl_2$, and $O_2$, setting the gas flow rate thereof to 25:25:10 (unit:sccm), and giving an RF (13.56 MHz) power of 500 W to a coiled electrode at a pressure of 1 Pa to generate plasma for the etching. The substrate side (sample stage) also receives an RF (13.56 MHz) power of 150 W to apply substantially negative self-bias voltage. Under the first etching conditions, the rate of etching the W film is 200.39 nm/min. and the rate of etching the TaN film is 80.32 nm/min. The selective ratio of W to TaN is therefore about 2.5. The W film is tapered under the first etching conditions at an angle of about 26°.

Thereafter the etching conditions are switched to second etching conditions without removing the resist masks. The etching gas is changed to $CF_4$ and $Cl_2$. The gas flow rate thereof is set to 30:30 (unit:sccm), and an RF (13.56 MHz) power of 500 W is given to a coiled electrode at a pressure of 1 Pa to generate plasma, performing the etching for about 30 seconds. The substrate side (sample stage) also receives an RF (13.56 MHz) power of 20 W to apply substantially negative self-bias voltage. Under the second etching conditions including the use of a mixture of $CF_4$ and $Cl_2$, the TaN film and the W film are etched to about the same degree. The rate of etching the W film is 58.97 nm/min. and the rate of etching the TaN film is 66.43 nm/min. under the second etching conditions.

In the first etching treatment, first conductive layers and second conductive layers are tapered around the edges by forming the resist masks into proper shapes and by the effect of the bias voltage applied to the substrate side. The angle of the tapered portions may be 15 to 45°.

The second etching treatment is conducted as in Embodiment 1. Here, $SF_6$, $Cl_2$, and $O_2$ are used as etching gas, the gas flow rate thereof is set to 24:12:24 (unit:sccm), and an RF (13.56 MHz) power of 700 W is given to a coiled electrode at a pressure of 1.3 Pa to generate plasma for 25 second etching. The substrate side (sample stage) also receives an RF (13.56 MHz) power of 10 W to apply substantially negative self-bias voltage. In the second etching treatment, the rate of etching the W film is 227.3 nm/min. and the rate of etching the TaN film is 32.1 nm/min. The selective ratio of W to TaN is therefore 7.1. The rate of etching the silicon oxynitride film (SiON) that serves as the gate insulating film is 33.7 nm/min. The selective ratio of W to TaN is 6.83. The W film is tapered in the second etching treatment at an angle of 70°.

Compared to Embodiment 1, the gate electrodes in this embodiment are higher in electric resistance because of being formed from a laminate of a W film and a TaN film but have higher heat resistance. Therefore the gate electrodes in this embodiment have advantages of not being influenced by activation or hydrogenation conditions.

Embodiment 3

This embodiment describes a process of manufacturing an active matrix liquid crystal display device from the active matrix substrate fabricated in Embodiment 1. The description is given with reference to FIG. 5.

Figure 4:
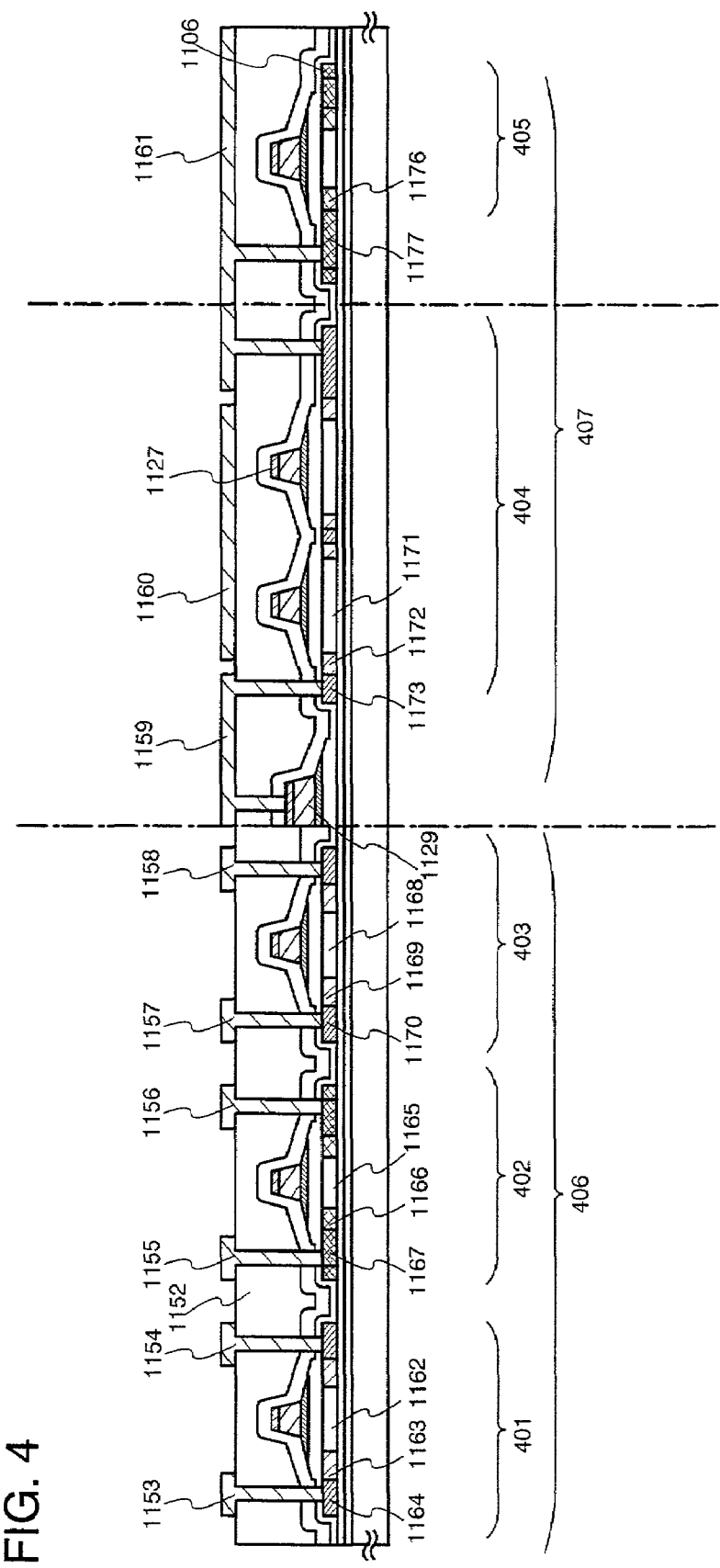
FIG. 4 is a diagram showing a process of manufacturing an active matrix substrate.

After the active matrix substrate as illustrated in FIG. 4 is obtained in accordance with Embodiment 1, an alignment film is formed on the active matrix substrate of FIG. 4 and subjected to rubbing treatment. In this embodiment, before the alignment film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An alignment film is formed over the entire surface of the opposite substrate and is subjected to rubbing treatment.

Then the opposite substrate is bonded to the active matrix substrate on which the pixel portion and the driving circuits are formed, using a sealing member (not shown). The sealing member has a filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 5:
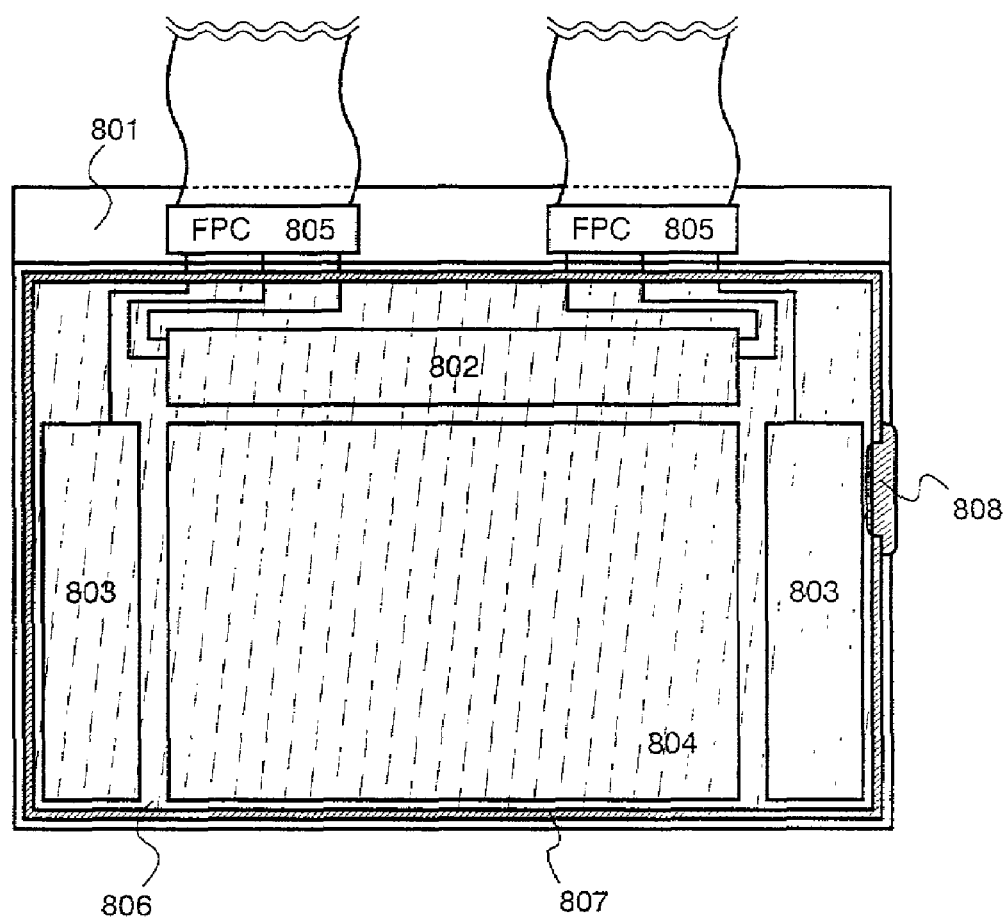
FIG. 5 is a top view showing the exterior of a liquid crystal module.

The structure of the thus obtained liquid crystal module is described with reference to the top view in FIG. 5.

A pixel portion 804 is placed in the center of an active matrix substrate 801. In FIG. 5, a source signal line driving circuit 802 for driving source signal lines is positioned above the pixel portion 804. Gate signal line driving circuits 803 for driving gate signal lines are placed to the left and right of the pixel portion 804. Although the gate signal line driving circuits 803 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 5 is preferred in terms of circuit operation reliability, driving efficiency, and the like.

Signals are inputted to the driving circuits from flexible printed circuits (FPC) 805. The FPCs 805 are press-fit through an anisotropic conductive film or the like after opening contact holes in the interlayer insulating film and resin film and forming a connection electrode so as to reach the wiring lines arranged in given places of the substrate 801. The connection electrode is formed from ITO in this embodiment.

A sealing agent 807 is applied to the substrate along its perimeter surrounding the driving circuits and the pixel portion. An opposite substrate 806 is bonded to the substrate 801 by the sealing agent 807 while a spacer formed in advance on the active matrix substrate keeps the distance between the two substrates constant. A liquid crystal element is injected through an area of the substrate that is not coated with the sealing agent 807. The substrates are then sealed by an encapsulant 808. The liquid crystal module is completed through the above steps.

Although all of the driving circuits are formed on the substrate in the example shown here, several ICs may be used for some of the driving circuits.

Embodiment 4

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole.

At the same time the connection electrode is formed, source electrodes or drain electrodes of other TFTs are formed.

Although all of the driving circuits are formed on the substrate in the example shown here, several ICs may be used for some of the driving circuits.

Figure 6:
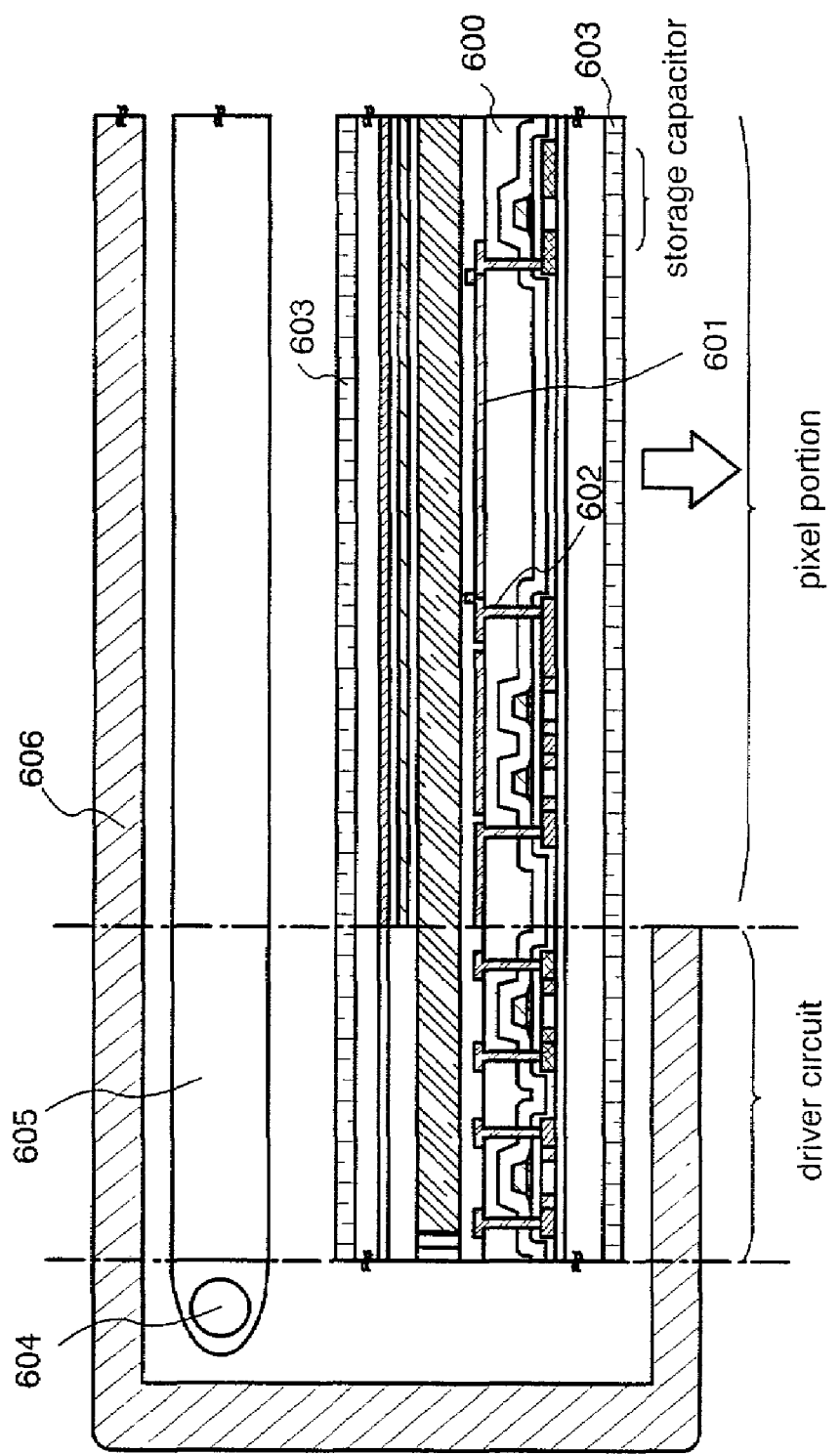
FIG. 6 is a sectional view showing an example of a liquid crystal display device.

An active matrix substrate is completed as above. A liquid crystal module is manufactured from this active matrix substrate in accordance with Embodiment 3. The liquid crystal module is provided with a backlight 604 and a light guiding plate 605, and is covered with a cover 606 to complete the active matrix liquid crystal display device of which a partial sectional view is shown in FIG. 6. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

Embodiment 5

Figure 7A:
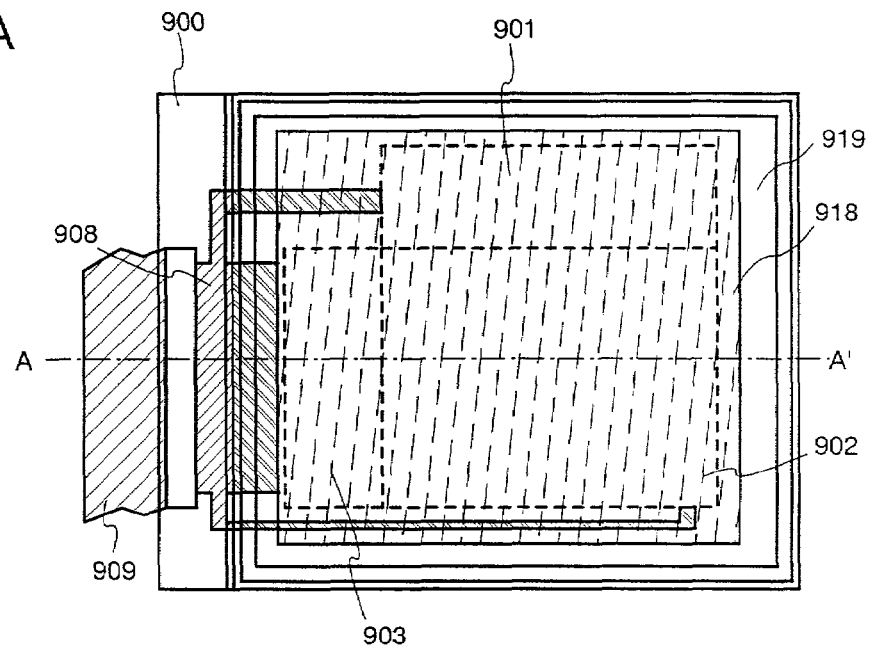
FIGS. 7A and 7B are a top view and sectional view of an EL module, respectively.
Figure 7B:
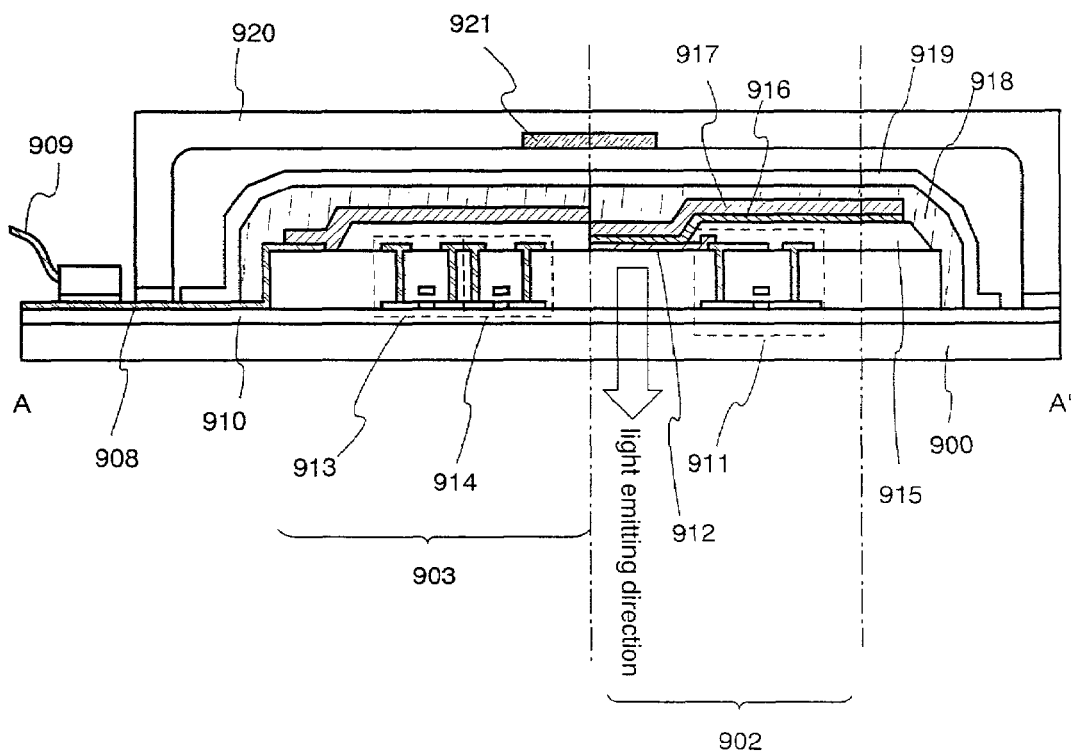

This embodiment describes with reference to FIGS. 7A and 7B an example of manufacturing a light emitting display that has an EL (electro luminescence) element.

FIG. 7A is a top view of an EL module and FIG. 7B is a sectional view taken along the line A–A' of FIG. 7A. A pixel portion 902, a source side driving circuit 901, and a gate side driving circuit 903 are formed on a substrate 900 (for example, a glass substrate, a crystallized glass substrate, or a plastic substrate) having an insulating surface. The pixel portion and the driving circuits are obtained in accordance with the above Embodiments. Denoted by 918 and 919 are a sealing member and a DLC film that serves as a protective film, respectively. The pixel portion and the driving circuits are covered with the sealing member 918, which is in turn covered with the protective film 919. The module is sealed by a cover member 920 using an adhesive. Desirably, the same material is used for the cover member 920 and the substrate 900 in order to avoid deformation by heat or external force. For example, a glass substrate is used for the cover member and is processed by sand blasting or the like to have a concave shape (3 to 10 µm in depth) shown in FIG. 7. It is desirable to further process the cover member to form a concave portion (50 to 200 µm in depth) for housing a drying agent 921. If the EL module is to be multifaceted, a $CO_2$ laser or the like is used to cut the module with ends flush after bonding the cover member to the substrate.

Though not shown in the drawing, circular polarizing means may be provided on the substrate 900 in order to avoid the reflection of the surroundings on the screen due to the reflective metal layer used (here, a cathode or the like). The circular polarizing means is composed of a phase difference plate (λ/4 plate) and a polarizing plate, and is called a circular polarizing plate.

908 denotes a wiring line for transmitting signals to be inputted to the source side driving circuit 901 and the gate side driving circuit 903. The wiring line 908 receives video signals and clock signals from an FPC (flexible printed circuit) 909 that serves as an external input terminal. The light emitting device of this embodiment may employ digital driving or analog driving and video signals used may be digital signals or analog signals. Although the FPC alone is shown in the drawing here, a printed wiring board (PWB) may be attached to the FPC. The term light emitting device in this specification refers to not only a light emitting device itself but also a light emitting device equipped with an FPC or a PWB. An intricate integrated circuit (memory, CPU, controller, D/A converter, and the like) may be formed on the same substrate on which the pixel portion and the driving circuits are formed, but it is difficult to achieve with a small number of masks. Accordingly, it is preferred to mount an IC chip having a memory, a CPU, a controller, a D/A converter, etc. by COG (chip on glass), TAB (tape automated bonding) or wire bonding.

The sectional structure of the light emitting device is described next with reference to FIG. 7B. An insulating film 910 is formed on the substrate 900. On the insulating film 910, the pixel portion 902 and the gate side driving circuits 903 are formed. The pixel portion 902 is composed of a plurality of pixels each having a current controlling TFT 911 and a pixel electrode 912 that is electrically connected to a drain of the TFT 911. The gate side driving circuit 903 is formed from a CMOS circuit that has a combination of an n-channel TFT 913 and a p-channel TFT 914.

These TFTs (including 911, 913, and 914) are manufactured in accordance with the above Embodiments.

The pixel electrode 912 functions as an anode of an EL element. Banks 915 are formed on both sides of the pixel electrode 912. An EL layer 916 is formed on the pixel electrode 912 and a cathode 917 of the EL element is formed thereon.

The EL layer 916 is for light emission and for moving carriers to emit light, and has a combination of electric charge transporting layers and electric charge injection layers in addition to a light emitting layer. The EL layer 916 is formed from, for example, a low molecular weight organic EL material, a middle molecular weight organic EL material, or a high molecular weight organic EL material. The EL layer may be a thin film of a light emitting material that emits light (fluorescence) by singlet excitation (singlet compound) or a thin film of a light emitting material that emits light (phosphorescence) by triplet excitation (triplet compound). The electric charge transporting layers and electric charge injection layers may be formed of inorganic materials such as silicon carbide. Known organic EL materials and inorganic materials can be used.

The cathode 917 also functions as a wiring line common to all the pixels, and is electrically connected to the FPC 909 through the connection wiring line 908. The elements included in the pixel portion 902 and in the gate side driving circuit 903 are all covered with the cathode 917, the sealing member 918, and the protective film 919.

A material transparent or translucent to visible light is preferably used for the sealing member 918. The material for the sealing member 918 is also preferred to allow as little moisture and oxygen as possible to transmit.

After the light emitting element is completely covered with the sealing member 918, the DLC film serving as the protective film 919 is formed at least on the surface (exposed surface) of the sealing member 918 as shown in FIG. 7B. Also, the protective film may be formed on the entire surface including a back side of the substrate. At this point, attention must be paid so as not to form the protective film in the area where the external input terminal (FPC) is to be provided. A mask may be employed to form the protective film avoiding the external input terminal area. Alternatively, a masking tape for use in a CVD apparatus may be used to cover the external input terminal area and avoid forming the protective film in the area.

With the above structure, the EL element is sealed by the sealing member 918 and the protective film to completely shut the EL element off of the outside. Moisture, oxygen, and other external substances that accelerate degradation of the EL layer due to an oxidation are thus prevented from entering the element. Therefore a highly reliable light emitting device can be obtained.

Figure 8:
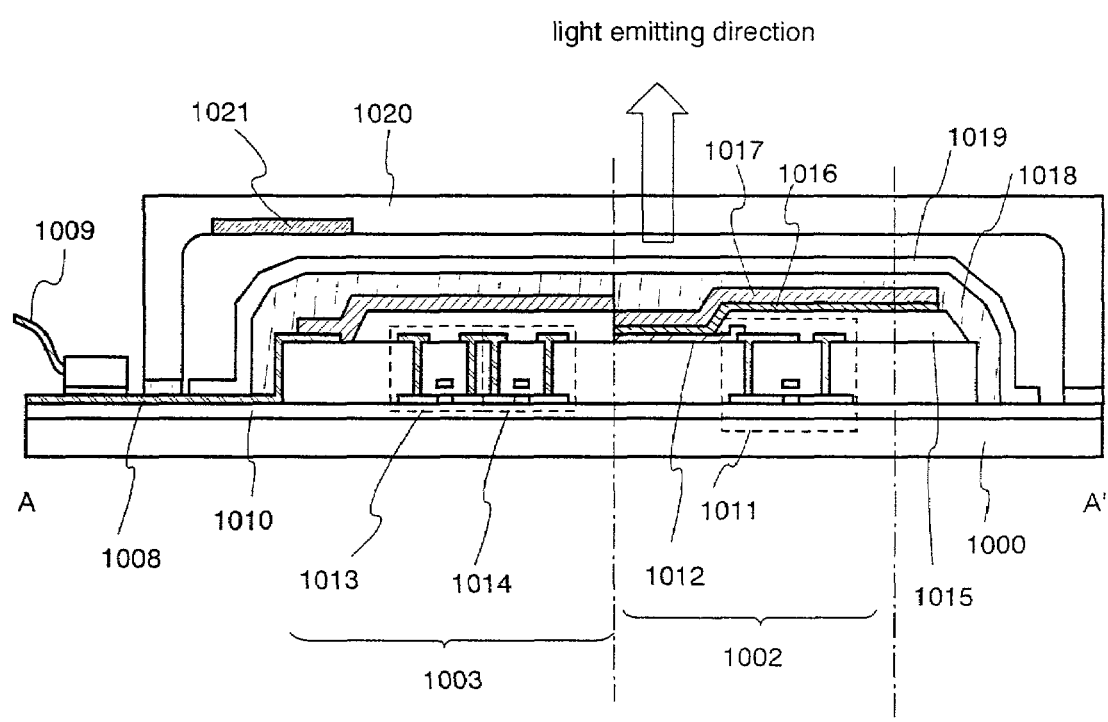
FIG. 8 is a sectional view of an EL module.

The cathode may serve as the pixel electrode and the EL layer and the anode may be layered on the cathode. Then the light emitting device emits light in the direction reverse to the direction shown in FIG. 7B. FIG. 8 shows an example of this light emitting device. A top view of the device is identical with FIG. 7A and therefore is omitted.

The sectional structure shown in FIG. 8 is described below. A substrate 1000 may be a glass substrate or a quartz substrate. A semiconductor substrate or a metal substrate may also be used. An insulating film 1010 is formed on the substrate 1000. A pixel portion 1002 and a gate side driving circuit 1003 are formed on the insulating film 1010. The pixel portion 1002 is composed of a plurality of pixels each having a current controlling TFT 1011 and a pixel electrode 1012 that is electrically connected to a drain of the TFT 1011. The gate side driving circuit 1003 is formed from a CMOS circuit that has a combination of an n-channel TFT 1013 and a p-channel TFT 1014.

The pixel electrode 1012 functions as a cathode of an EL element. Banks 1015 are formed on both sides of the pixel electrode 1012. An EL layer 1016 is formed on the pixel electrode 1012 and an anode 1017 of the EL element is formed thereon.

The anode 1017 also functions as a wiring line common to all the pixels, and is electrically connected to an FPC 1009 through a connection wiring line 1008. The elements included in the pixel portion 1002 and in the gate side driving circuit 1003 are all covered with the anode 1017, a sealing member 1018, and a protective film 1019 that is formed of DLC or the like. A cover member 1020 is bonded to the substrate 1000 using an adhesive. The cover member has a concave portion for housing a drying agent 1021.

A material transparent or translucent to visible light is preferably used for the sealing member 1018. The material for the sealing member 1018 is also preferred to allow as little moisture and oxygen as possible to transmit.

In FIG. 8, the pixel electrode serves as the cathode and the EL layer and the anode are layered thereon. Therefore light is emitted in the direction indicated by the arrow in FIG. 8.

This embodiment may be combined with Embodiment 1 or Embodiment Mode.

Embodiment 6

The driving circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 9A–9F, 10A–10D and 11A–11C.

FIG. 9A is a personal computer which comprises: a main body 2001; an image input section 2002; a display section 2003; and a keyboard 2004.

FIG. 9B is a video camera which comprises: a main body 2101; a display section 2102; a voice input section 2103; operation switches 2104; a battery 2105 and an image receiving section 2106.

FIG. 9C is a mobile computer which comprises: a main body 2201; a camera section 2202; an image receiving section 2203; operation switches 2204 and a display section 2205.

FIG. 9D is a goggle type display which comprises: a main body 2301; a display section 2302; and an arm section 2303.

FIG. 9E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet.

FIG. 9F is a digital camera which comprises: a main body 2501; a display section 2502; a view finder 2503; operation switches 2504; and an image receiving section (not shown in the figure).

Figure 10A:
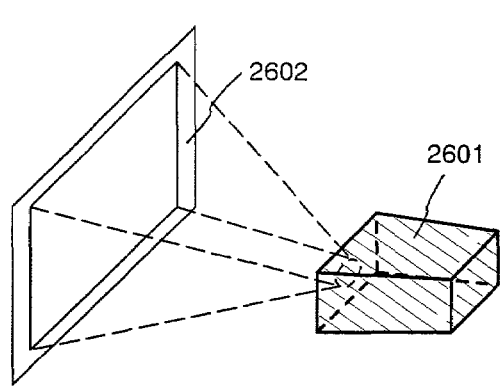
FIGS. 10A to 10D are diagrams showing examples of electronic equipment.

FIG. 10A is a front type projector which comprises: a projection system 2601; and a screen 2602. Embodiment 4 can be applied to the liquid crystal module 2808 which forms a part of the projection system 2601 to complete the whole system.

Figure 10B:
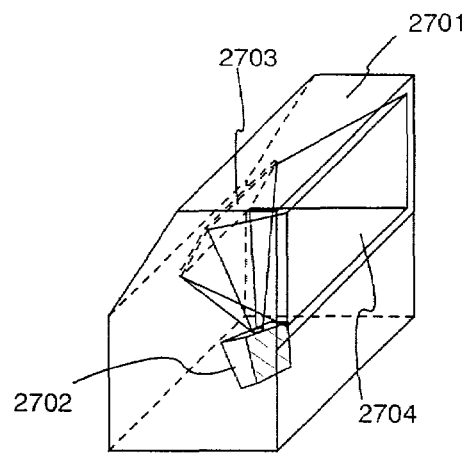

FIG. 10B is a rear type projector which comprises: a main body 2701; a projection system 2702; a mirror 2703; and a screen 2704. Embodiment 4 can be applied to the liquid crystal module 2808 which forms a part of the projection system 2702 to complete the whole system.

Figure 10C:
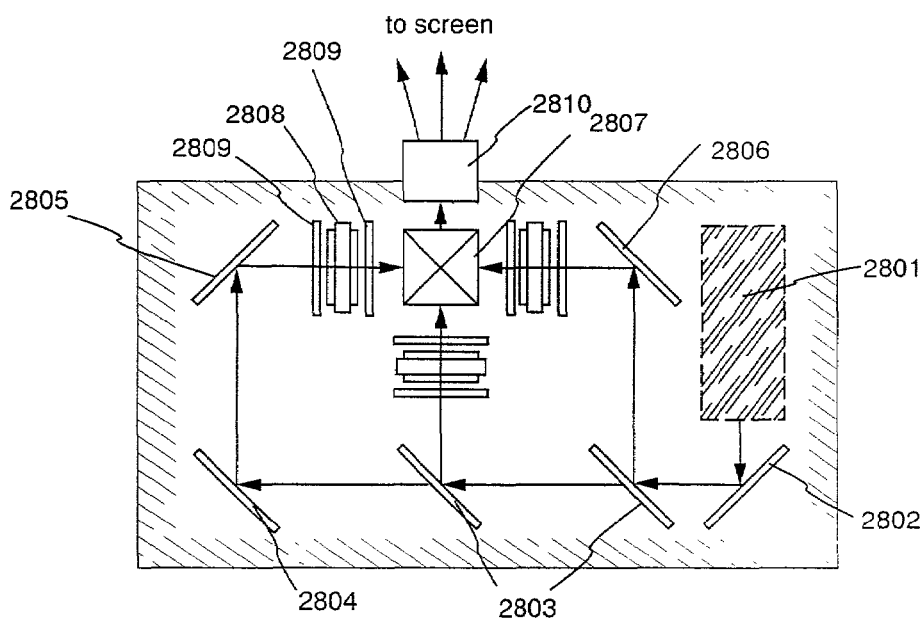

FIG. 10C is a diagram which shows an example of the structure of a projection system 2601 and 2702 in FIGS. 10A and 10B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 10C.

Figure 10D:
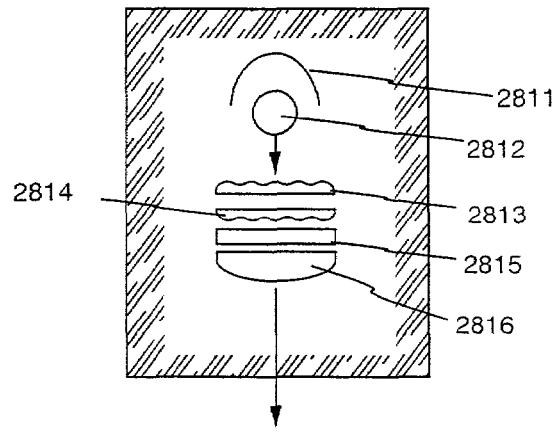

FIG. 10D is a diagram showing an example of a structure of an optical light source system 2801 in FIG. 10C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 10D is merely an example and the structure is not limited to this example. For instance, an operator may appropriately dispose an optical lens, a film which has a function to polarize light, a film which adjusts a phase difference or an IR film, etc.

Note that the projectors shown FIGS. 10A–10D are the cases of using a transmission type electro-optical device, and applicable examples of a reflection type electro-optical device and an EL module are not shown.

Figure 11A:
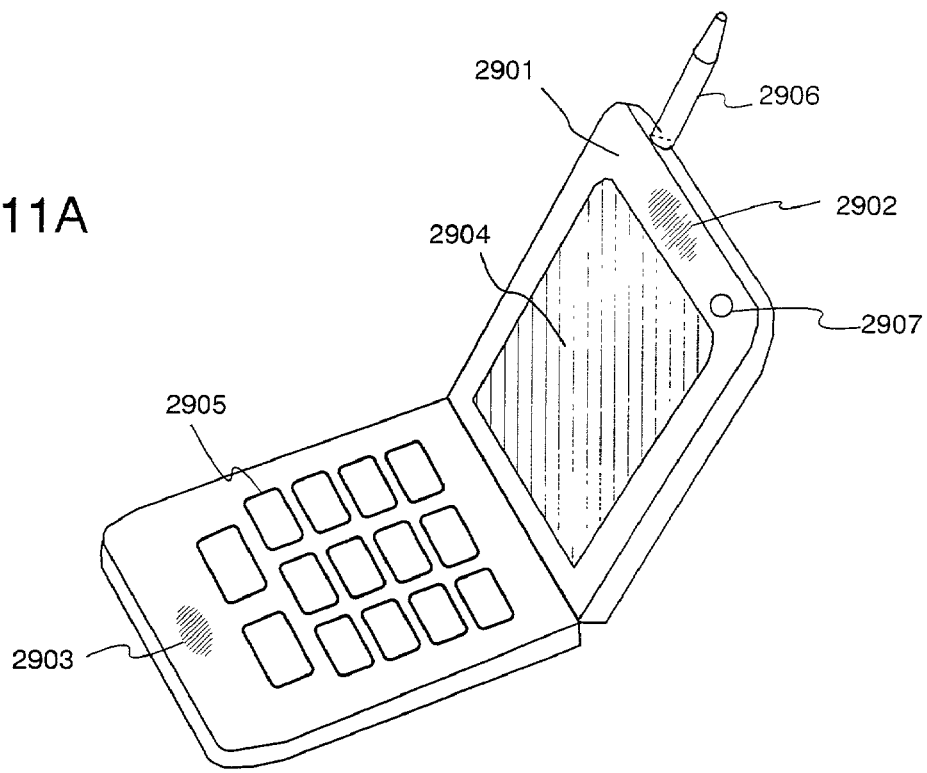
FIGS. 11A to 11C are diagrams showing examples of electronic equipment.

FIG. 11A is a portable telephone which comprises: a main body 2901; a voice output section 2902; a voice input section 2903; a display section 2904; operation switches 2905; an antenna 2906; and an image input section (CCD, image sensor, etc.) 2907 etc.

Figure 11B:
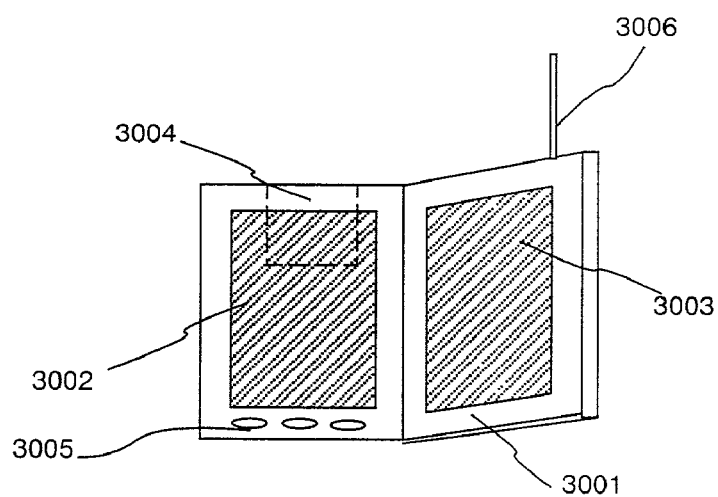

FIG. 11B is a portable book (electronic book) which comprises: a main body 3001; display sections 3002 and 3003; a recording medium 3004; operation switches 3005 and an antenna 3006 etc.

Figure 11C:
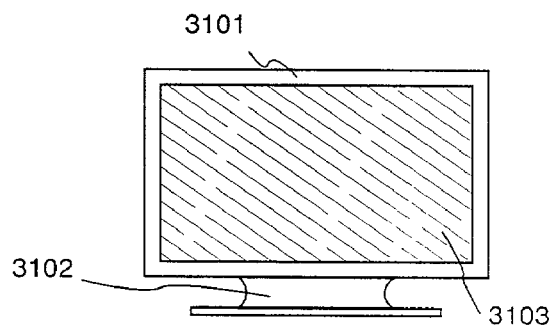

FIG. 11C is a display which comprises: a main body 3101; a supporting section 3102; and a display section 3103 etc.

As described above, the applicable range of the present invention is very large, and the invention can be applied to electronic apparatuses of various areas. Note that the electronic devices of this embodiment can be achieved by utilizing any combination of constitutions in Embodiments 1 to 5.

Embodiment 7

In this embodiment, an experiment is conducted following the procedures below to obtain the relation between the concentration of a rare gas element in an amorphous silicon film formed by sputtering and the film formation pressure.

An amorphous silicon film containing a rare gas element is formed on a glass substrate by a sputtering apparatus using an RF power supply. A silicon target is used and the gas (Ar) flow rate is set to 50 sccm, the film formation power to 3 kW, and the substrate temperature to 150° C. The film formation pressure is changed every time the film reaches 0.2 µm in thickness. The film formation pressure is adjusted with a conductance valve on the exhaust side. The films each having a thickness of 0.2 µm and respectively formed at a pressure of 0.2 Pa, 0.4 Pa, 0.6 Pa, 0.8 Pa, 1.0 Pa, and 1.2 Pa are sequentially layered on the glass substrate. The atomic concentration of Ar in the formed films is measured by secondary ion mass spectroscopy (SIMS). The results obtained are shown in FIG. 12. In FIG. 12, the axis of ordinate indicates the atomic concentration of Ar and the axis of abscissa indicates the depth from the surface of the sample. FIG. 12 also shows the ion intensity of silicon with its axis of ordinate indicating the secondary ion intensity and its axis of abscissa indicating the depth from the surface of the sample.

The results in FIG. 12 show that lower film formation pressure makes a film higher in atomic concentration of Ar, namely, a better film as a gettering site. A lower film formation pressure brings the atomic concentration of Ar in the film higher because, when the film formation pressure in sputtering is low, the probability is small for collision between Ar gas and recoil atoms (Ar atoms reflected at the target surface) in the reaction chamber, making it easier for the recoil atoms to enter the substrate.

A preferable gettering site (amorphous silicon film containing argon) in the above Embodiment Mode is therefore formed at a film formation pressure suitably set by consulting FIG. 12.

According to the results of the experiment conducted by the present inventors, the film formation pressure that provides a film high in atomic concentration of Ar and the best distribution in the substrate is 0.3 Pa.

Embodiment 8

In this embodiment, the sample obtained in Embodiment 7 and FIG. 12 are used and the internal stress of the films is measured to obtain the relation between the atomic concentration of the rare gas element in the films formed by sputtering and the internal stress of the films. The relation thereof is shown in FIG. 13.

The average atomic concentration of Ar in the film that is formed at a film formation pressure of 0.2 Pa is calculated from FIG. 12, and the internal stress in the film is measured. Then the obtained data are plotted. Similarly, the average atomic concentration of Ar is calculated and the internal stress is measured for each of the films respectively formed at a film formation pressure of 0.4 Pa, 0.8 Pa, and 1.2 Pa. Then the data are plotted and the graph in FIG. 13 is thus obtained.

FIG. 13 shows that the compressive stress is higher when the atomic concentration of Ar in the film is higher.

Accordingly, it is desirable in the above Embodiment Mode to adjust the atomic concentration of Ar so as to avoid peeling of the film in later heat treatment and to adjust internal stress of the amorphous silicon film containing a rare gas element and the internal stress of the film layered on the amorphous silicon film by consulting FIG. 13.

Embodiment 9

In this embodiment, an experiment is conducted following the procedures below to obtain the relation between the thickness of a gettering site, namely, a second semiconductor film, and the nickel/silicon concentration ratio on the surface.

To prepare a sample, a silicon oxynitride film serving as a base insulating film (150 nm in thickness) and an amorphous silicon film are layered on a glass substrate without exposing them to the air, and the amorphous silicon film is crystallized using nickel to form a semiconductor film having a crystal structure. Here, a nickel acetate solution containing 10 ppm of nickel by weight is applied by a spinner to the amorphous silicon film with a thickness of 50 nm. The substrate then receives heat treatment (at 500° C. for an hour) in a furnace for dehydrogenation and another heat treatment at 550° C. for four hours to obtain a silicon film having a crystal structure. At this point, the nickel concentration and silicon concentration on the surface is measured by TXRF (total reflection X-ray fluorescence) and the ratio of nickel concentration to the silicon concentration (nickel/silicon concentration ratio) is calculated. As a result, the ratio is $1.5 \times 10^{-4}$ to $2 \times 10^{-4}$.

Next, the semiconductor film is irradiated with laser light (XeCl) in order to raise the crystallization ratio and repair defects remaining in crystal grains. Through this laser light irradiation, a thin oxide film is formed on the silicon film having a crystal structure. At this point, the nickel/silicon concentration ratio is again calculated by TXRF and the obtained result is $2 \times 10^{-3}$ to $8 \times 10^{-3}$. This change is brought because the scattering effect is increased by ridges or the like formed on the surface by the laser light irradiation and because nickel segregates near the surface.

The oxide film formed by the laser light irradiation and an oxide film formed by treating the surface with ozone water for 120 seconds together make a barrier layer that has a thickness of 1 to 5 nm in total. On the barrier layer, a silicon film containing a rare gas element is formed by sputtering to serve as a gettering site. Here, the flow rate of Ar is set to 50 sccm, the film formation pressure to 0.2 Pa, the film formation power to 3 kW, and the substrate temperature to 150° C. In order to examine the film thickness dependency of the gettering site, films varying in thickness from 5 nm to 150 nm are irradiated with light for gettering at 650° C. for 3 minutes using a multi-task type lamp annealing apparatus that has 21 tungsten halogen lamps in total. This lamp annealing apparatus can monitor the temperature from under the substrate using a pyrometer. Values displayed on the pyrometer are deemed as the heating temperature of the lamp annealing apparatus in this specification. Under the conditions given in the above, the gettering site contains argon elements in an atomic concentration of $3 \times 10^{20}$ to $6 \times 10^{20}/cm^3$, and contains oxygen in an atomic concentration of $1 \times 10^{19}$ to $3 \times 10^{19}/cm^3$.

After gettering is conducted under the irradiation conditions given in the above, the gettering site and the barrier layer are removed. Then the nickel/silicon concentration ratio is calculated by TXRF, and the relation between the obtained values and the thickness of the gettering site is shown in FIG. 14.

FIG. 14 shows that the nickel/silicon concentration ratio is lower and the gettering effect is higher when the gettering site is thicker.

A preferable thickness of the gettering site in the above Embodiment Mode is set suitably by consulting FIG. 14.

FIG. 14 also shows that, when the gettering site is thinner than 50 nm, fluctuation is large between the films formed and there are portions on the surface where the nickel concentration is high with respect to the silicon concentration. Therefore the thickness of the gettering site (amorphous silicon film containing a rare gas element) is desirably 50 nm or more, at least, while the silicon film having a crystal structure is 50 nm in thickness.

Before the gettering site is removed, the surface state of the gettering site is observed with an optical microscope and pictures thereof are shown in FIGS. 15A to 15C. FIG. 15A shows the surface state of the gettering site when it is 20 nm in thickness. FIG. 15B shows the surface state of the gettering site when it is 50 nm in thickness. FIG. 15C shows the surface state of the gettering site when it is 150 nm in thickness. As observed in FIGS. 15A to 15C, a crystal nucleus is generated on the surface of the gettering site by irradiation of light for gettering (at 650° C. for 3 minutes). It is found from the observation that the crystal nucleus grows larger when the gettering site is thinner. Accordingly, an increase in thickness of gettering site leads not only to an increase in total volume of the gettering site but also to an increase in volume of the uncrystallized portion of the gettering site, and this contributes to an increase in gettering effect.

Gettering sites each having a thickness of 150 nm are irradiated with light for gettering under varying conditions; at 650° C. for 3 minutes, at 650° C. for 5 minutes, and at 700° C. for 3 minutes. Then surfaces of the gettering sites are compared to reveal that the crystal nucleus grows larger when the treatment time is longer and the temperature is higher.

Embodiment 10

In this embodiment, an experiment is conducted following the procedures below to examine the crystallinity of a silicon film having a crystal structure before and after gettering.

Figure 16:
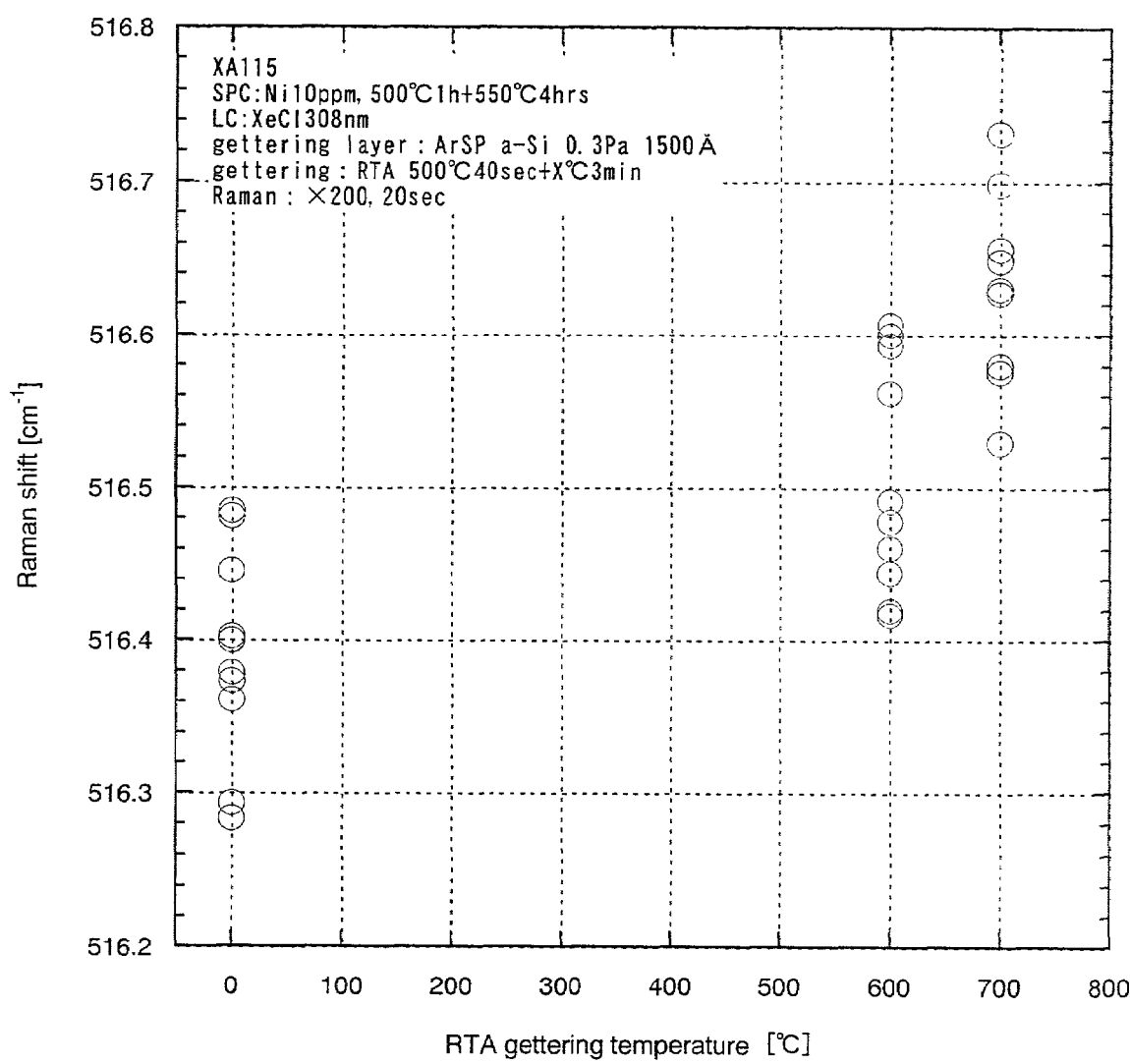
FIG. 16 is a graph showing a difference in Raman shift which is brought as a result of gettering.
Figure 17:
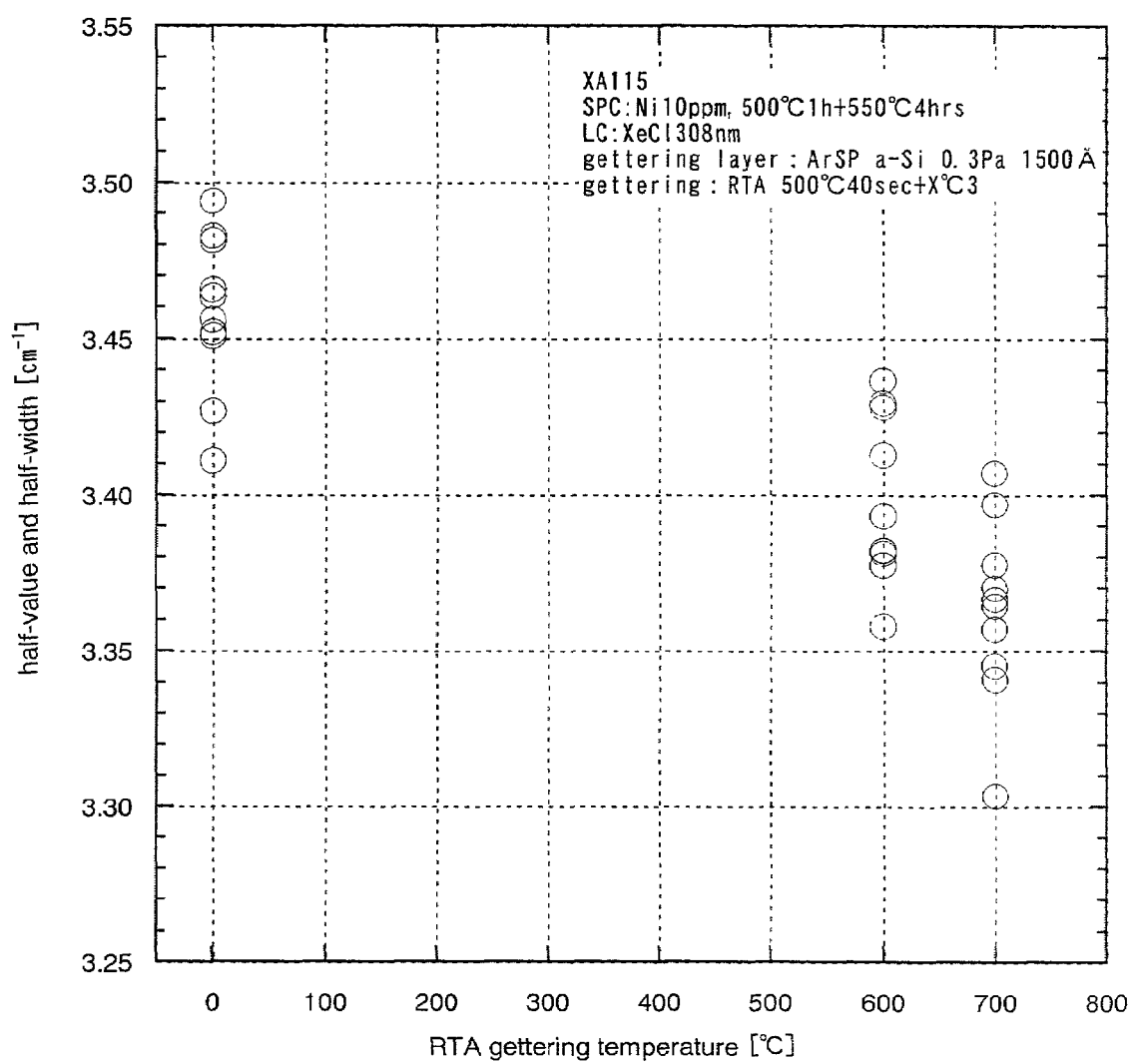
FIG. 17 is a graph showing a difference in Raman half-value and half-width which is brought as a result of gettering.

To prepare a sample, a base insulating film, a silicon film having a crystal structure, oxide films serving as a barrier layer, and a gettering site are layered on a glass substrate in accordance with the procedures of Embodiment 9. After the gettering site is formed, heat treatment is conducted at 500° C. for 40 seconds using a lamp annealing apparatus. Thereafter gettering is carried out by the heat treatment using a lamp annealing apparatus under varying conditions; at 600° C. for 3 minutes and at 700° C. for 3 minutes. The gettering site and the barrier layer are then removed and Raman optical characteristics of the silicon film having a crystal structure are measured for each of the samples subjected to different heat treatment in the gettering steps. The thus obtained Raman shift and Raman half-value and half-width are shown in FIG. 16 and FIG. 17, respectively. In FIG. 16, the data plotted at 0° C. is of the sample that receives only the heat treatment at 500° C. for 40 seconds by a lamp annealing apparatus. It is read from FIGS. 16 and 17 that, when the temperature is higher in the gettering by a lamp annealing apparatus, the Raman shift is higher and the crystallinity of the silicon film having a crystal structure is more improved at the same time gettering is achieved.

Accordingly, in the above Embodiment Mode, the crystallinity of the silicon film having a crystal structure is improved at the same time gettering is achieved.

Embodiment 11

In this embodiment, an experiment is conducted following the procedures below to obtain the optimum temperature of heat treatment for gettering in the case where a lamp annealing apparatus is employed.

To prepare a sample, an amorphous silicon film with a thickness of 50 nm is formed on a quartz substrate, a nickel acetate solution containing 10 ppm of nickel by weight is applied by a spinner to the amorphous silicon film, and the film is irradiated with light at 700° C. for 110 seconds using a multi-task type lamp annealing apparatus that has 21 tungsten halogen lamps in total, thereby obtaining a silicon film having a crystal structure. Next, the film is irradiated with laser light (XeCl) in order to raise the crystallization ratio and repair defects remaining in crystal grains. An oxide film is formed through the above laser light irradiation. This oxide film and an oxide film formed by treating the surface with ozone water for 120 seconds together make a barrier layer that has a thickness of 1 to 5 nm in total. On the barrier layer, a silicon film containing a rare gas element is formed by sputtering to serve as a gettering site. Here, the gettering site is an amorphous silicon film containing argon. The amorphous silicon film is formed to a thickness of 150 nm by sputtering at a film formation pressure of 0.3 Pa. Under the conditions given in the above, the gettering site contains argon elements in an atomic concentration of $3 \times 10^{20}$ to $6 \times 10^{20}/cm^3$, and contains oxygen in an atomic concentration of $1 \times 10^{19}$ to $3 \times 10^{19}/cm^3$. Thereafter, heat treatment is conducted at 500° C. for 40 seconds using a lamp annealing apparatus, and then gettering is carried out at 500 to 750° C. for 3 minutes.

Figure 18:
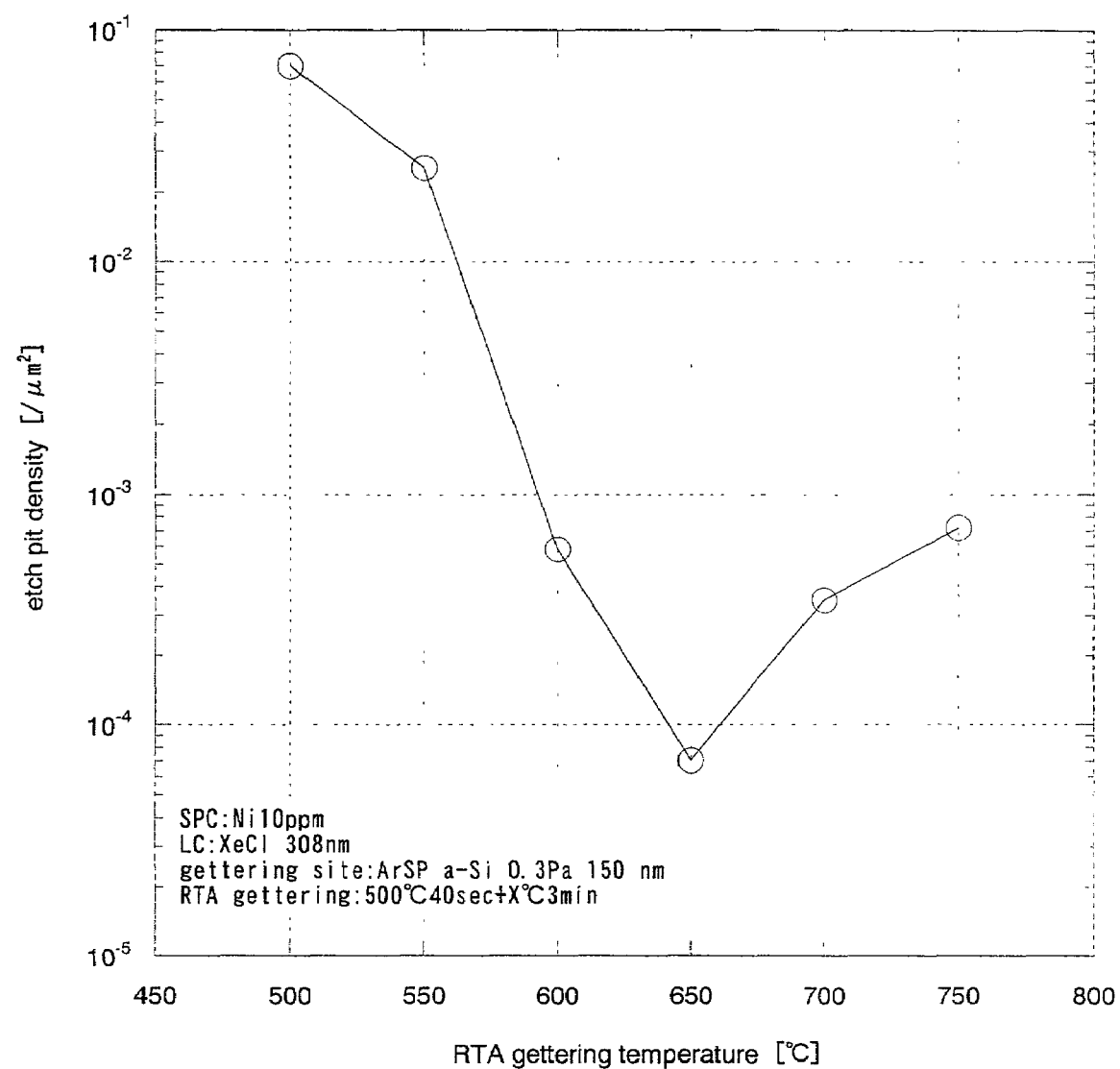
FIG. 18 is a graph showing the relation between the gettering temperature and the etch pit density.

Gettering effects obtained at different temperatures are compared using the etch pit density as an index. The etch pit density is obtained by counting the number of etch pits through observation by an optical microscope. The etch pits are formed by treating the surface of the silicon film having a crystal structure with FPM after the gettering site and the barrier layer are removed. FIG. 18 shows the results in relation to the etch pit density.

Most of nickel used in doping is remained as nickel silicides in the silicon film having a crystal structure. Nickel silicides are known to be etched away with FPM (a mixture of fluoric acid, hydrogen peroxide solution, and pure water). Therefore the gettering effect can be confirmed from the presence or absence of etch pits after treating the to-be-gettered region (here, the silicon film having a crystal structure) with FPM. In this case, having less etch pits means a higher gettering effect.

It is read from FIG. 18 that the temperature at which the highest gettering effect is obtained ranges between 650° C. and 700° C. In a sample that receives gettering at 700° C. or lower, the substrate is hardly deformed. On the other hand, the substrate is largely deformed in a sample that is subjected to gettering at 750° C.

Accordingly, when a lamp annealing apparatus is used in gettering in the above Embodiment Mode, the process temperature is suitably set by consulting FIG. 18.

Embodiment 12

In this embodiment, an experiment is conducted following the procedures below to examine changes in distribution of the nickel element concentration and argon element concentration through gettering.

To prepare a sample, a silicon oxynitride film is formed as a base insulating film (150 nm in thickness) on a glass substrate, a silicon film having a crystal structure (50 nm in thickness) and oxide films as a barrier layer (1 to 5 nm in thickness) are formed in accordance with the procedure of Embodiment 11, and an amorphous silicon film containing argon is formed as a gettering site by sputtering at a film formation pressure of 0.3 Pa to a thickness of 150 nm. Under the conditions given in the above, the gettering site contains argon elements in an atomic concentration of $3 \times 10^{20}$ to $6 \times 10^{20}/cm^3$, and contains oxygen in an atomic concentration of $1 \times 10^{19}$ to $3 \times 10^{19}/cm^3$.

After the gettering site is formed, a lamp annealing apparatus is used to irradiate samples with light for gettering under varying conditions; at 550° C. for 3 minutes, at 650° C. for 3 minutes, and at 750° C. for 3 minutes. Then the atomic concentration of nickel and the atomic concentration of argon are measured by SIMS, respectively.

Figure 19:
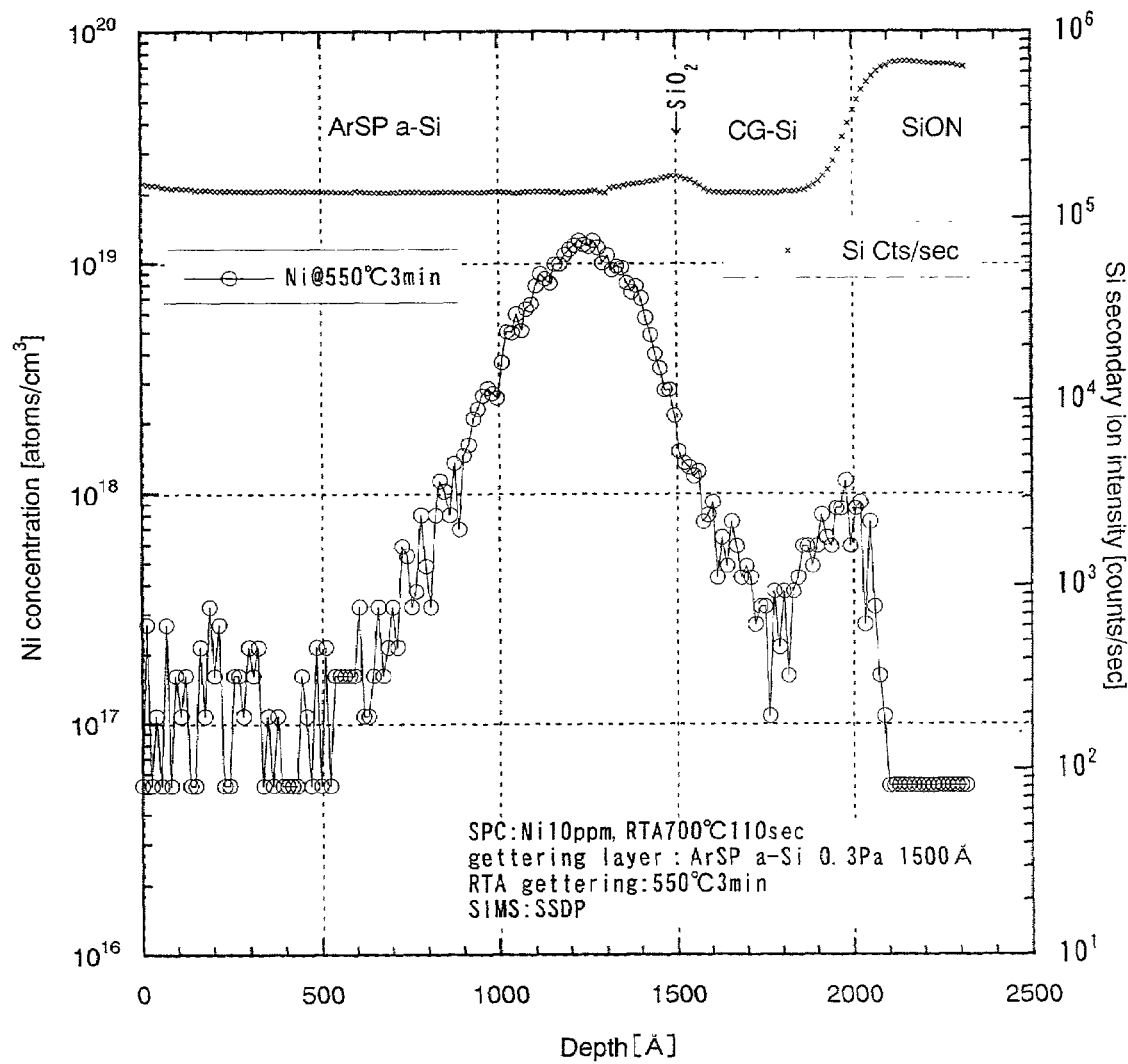
FIG. 19 is a graph of nickel concentration profile after gettering (at 550° C. for 3 minutes)
Figure 20:
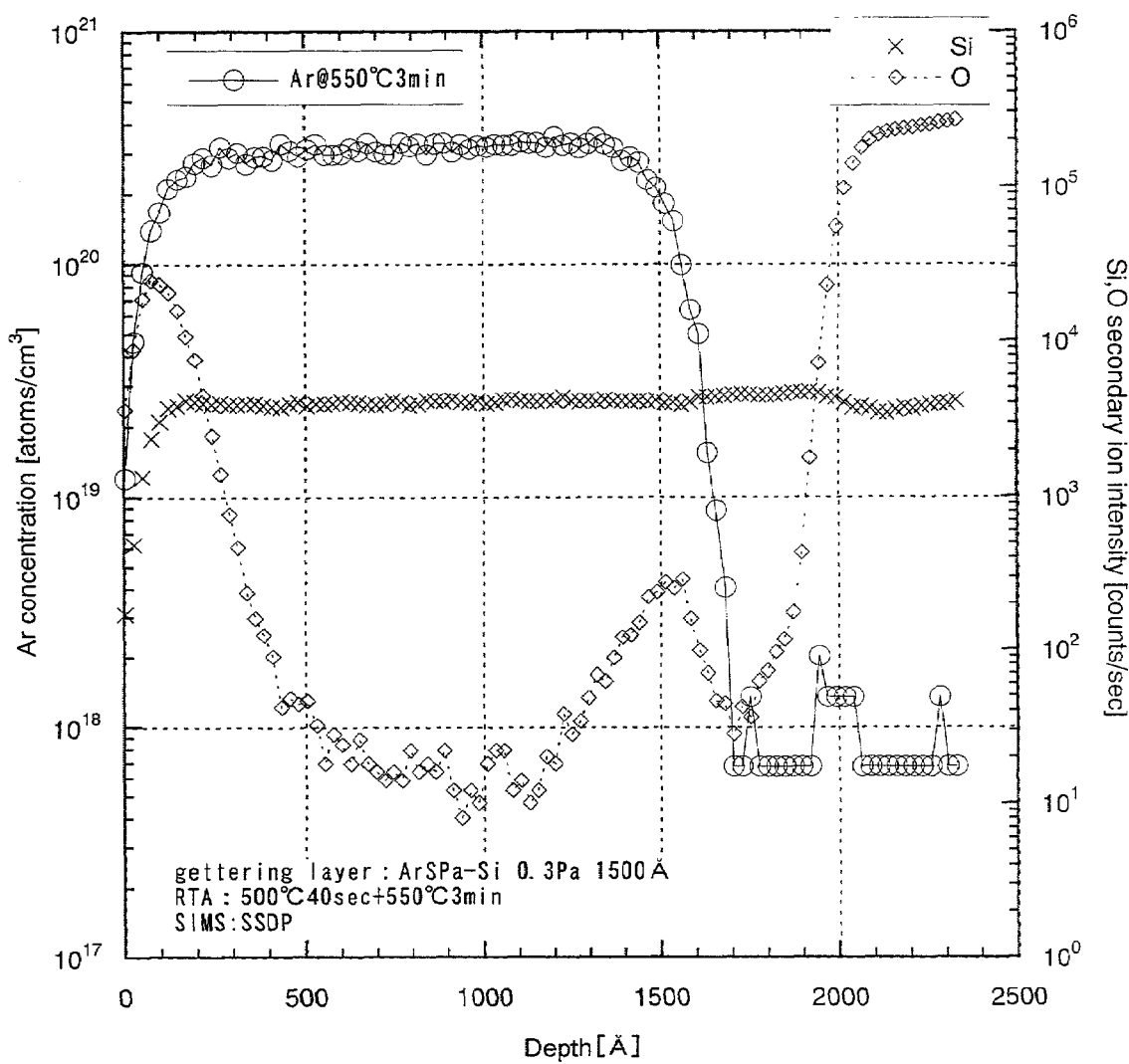
FIG. 20 is a graph of argon concentration profile and oxygen concentration profile after gettering (at 550° C. for 3 minutes)

FIG. 19 shows the atomic concentration distribution of nickel after light irradiation at 550° C. for 3 minutes and FIG. 20 shows the atomic concentration distribution of argon in the same sample. It is understood from FIG. 19 that nickel that is contained in the silicon film having a crystal structure is partially diffused and moved to the gettering site, namely, gettering has taken place. However, light irradiation at 550° C. for 3 minutes is not successful in achieving satisfactory gettering and the silicon film having a crystal structure has remaining nickel in an atomic concentration of $1 \times 10^{17}$ to $1 \times 10^{18}/cm^3$ as shown in FIG. 19.

Figure 21:
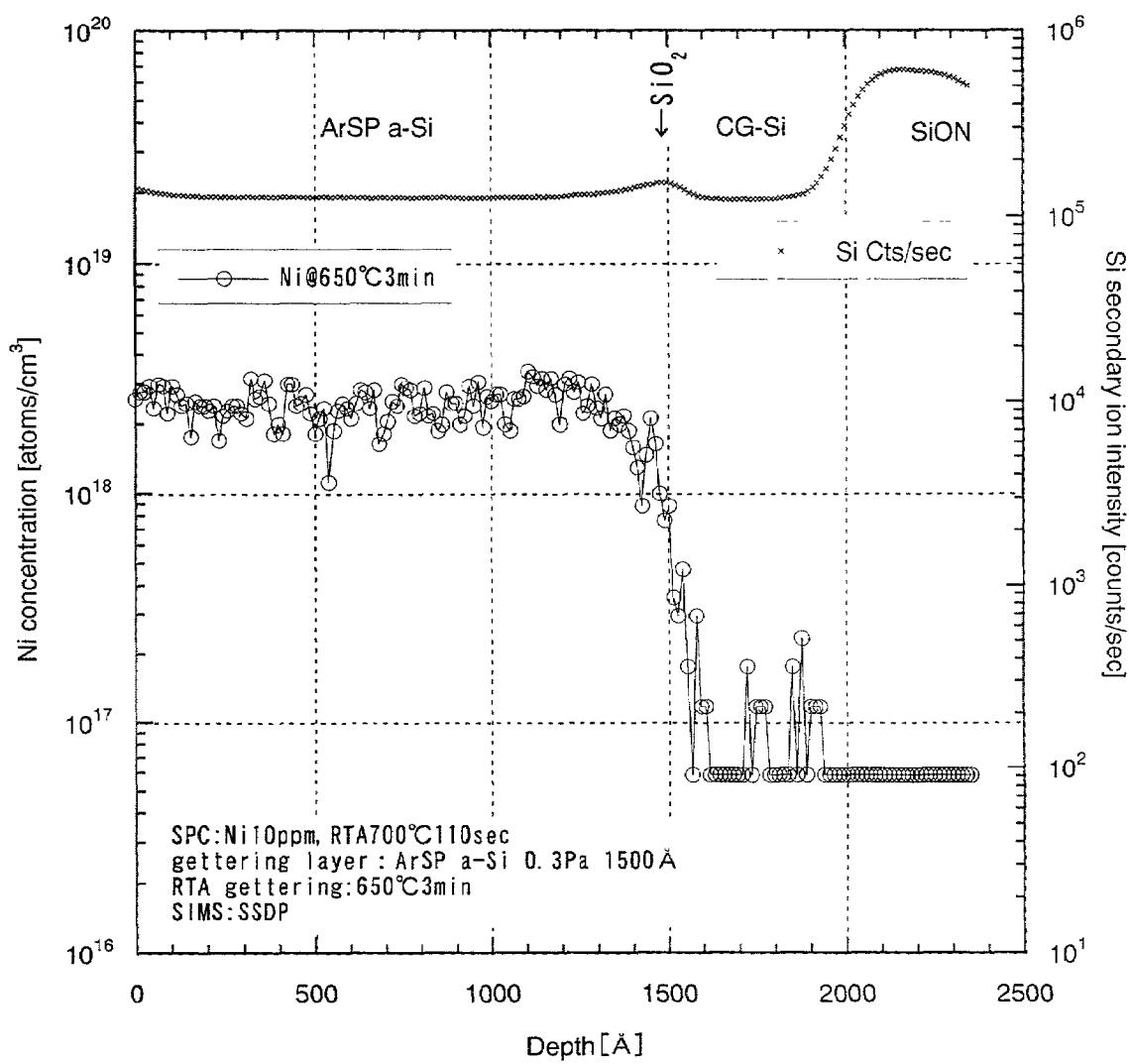
FIG. 21 is a graph of nickel concentration profile after gettering (at 650° C. for 3 minutes)
Figure 22:
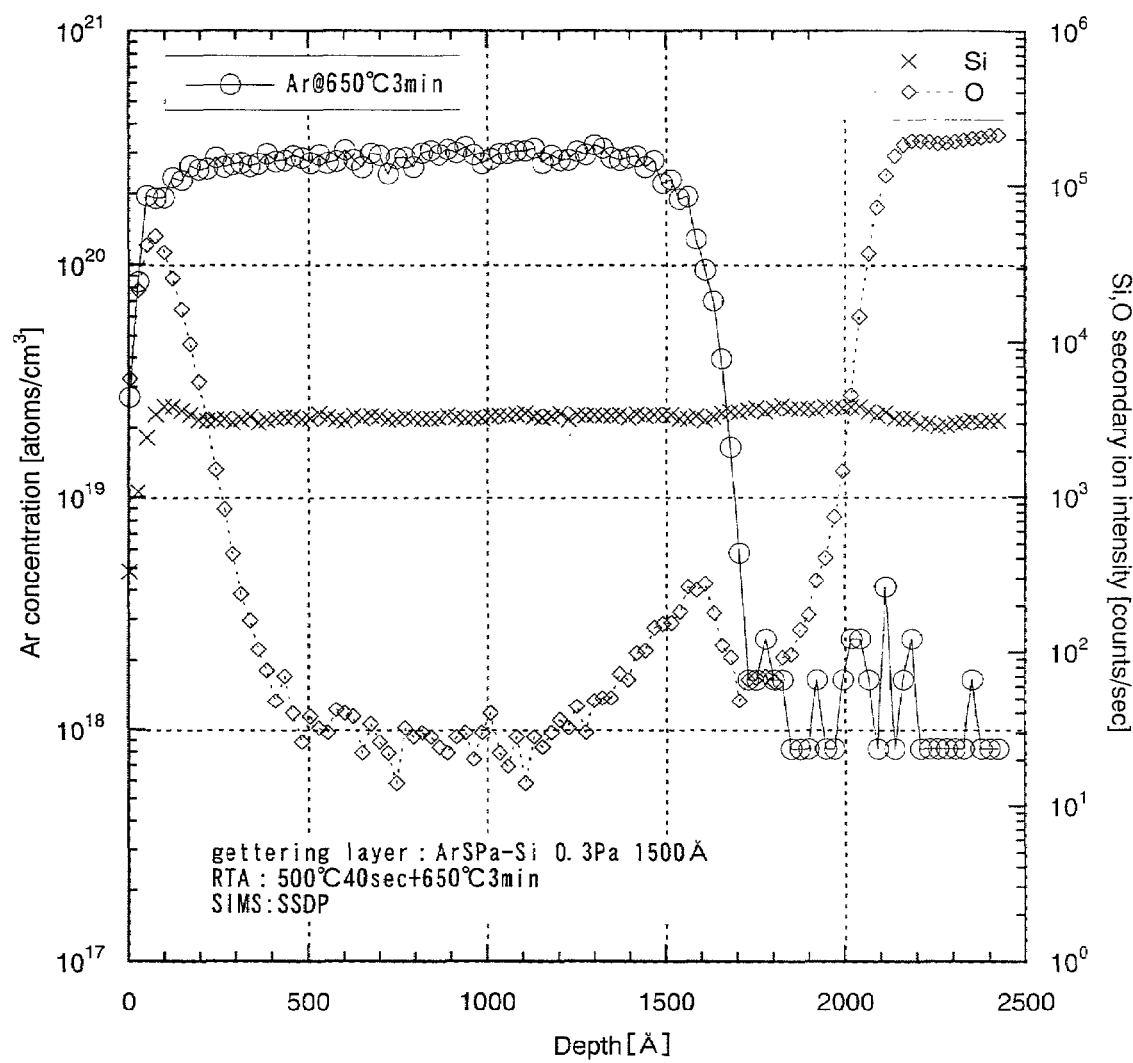
FIG. 22 is a graph of argon concentration profile and oxygen concentration profile after gettering (at 650° C. for 3 minutes)

FIG. 21 shows the atomic concentration distribution of nickel after light irradiation at 650° C. for 3 minutes and FIG. 22 shows the atomic concentration distribution of argon in the same sample. It is read from FIG. 21 that diffused nickel is contained in the gettering site in a concentration of $1 \times 10^{18}$ to $3 \times 10^{18}/cm^3$, and that the nickel in the silicon film having a crystal structure is reduced to approximately $5 \times 10^{16}/cm^3$, which is the lower detection limit. Therefore light irradiation at 650° C. for 3 minutes is successful in achieving satisfactory gettering.

Figure 23:
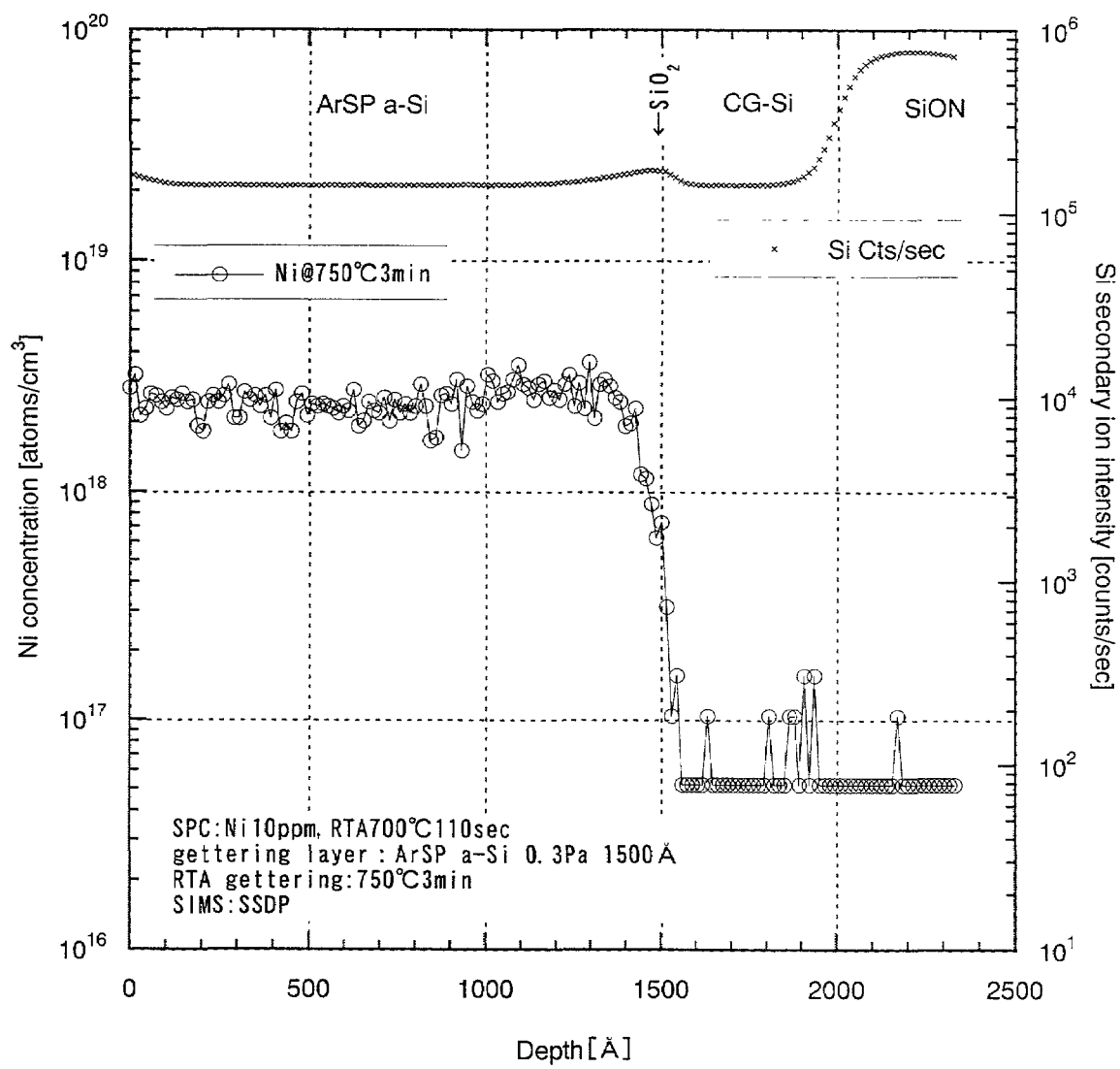
FIG. 23 is a graph of nickel concentration profile after gettering (at 750° C. for 3 minutes)
Figure 24:
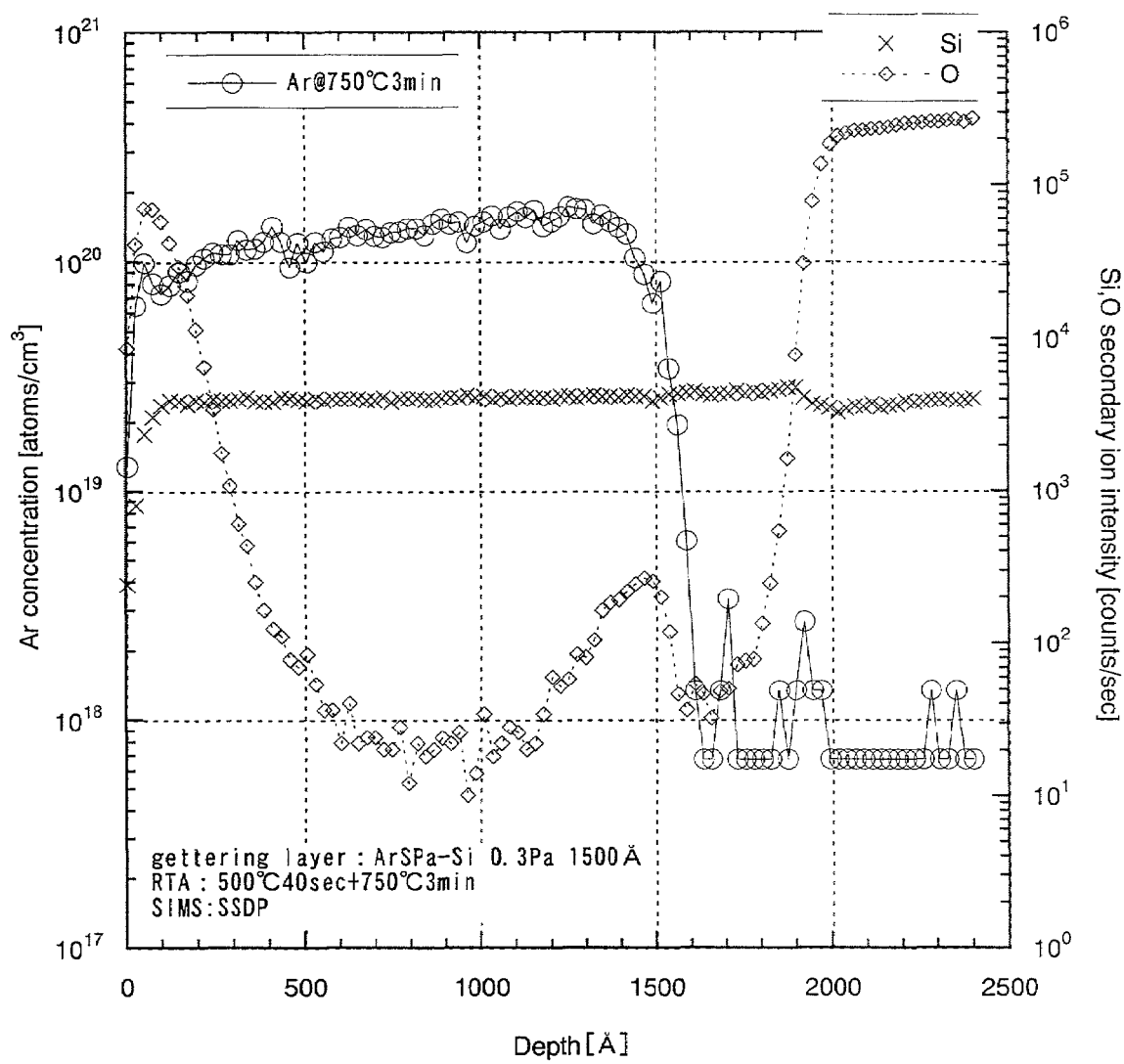
FIG. 24 is a graph of argon concentration profile and oxygen concentration profile after gettering (at 750° C. for 3 minutes)

FIG. 23 shows the atomic concentration distribution of nickel after light irradiation at 750° C. for 3 minutes and FIG. 24 shows the atomic concentration distribution of argon in the same sample. It is read from FIG. 23 that satisfactory gettering is achieved as in light irradiation at 650° C. for 3 minutes. The atomic concentration of argon contained in the gettering site in FIG. 24 is lower than in FIGS. 20 and 22. This is because argon contained in the gettering site is released to the outside of the film by light irradiation at 750° C. for 3 minutes.

From the results in FIGS. 19 to 24, it is confirmed that nickel in the silicon film having a crystal structure is actually moved to the gettering site by gettering in the above Embodiment Mode.

Embodiment 13

In this embodiment, an experiment is conducted following the procedures below to confirm that a silicon film having a crystal structure is not doped with argon when an amorphous silicon film containing argon is formed by sputtering to serve as a gettering site. The experiment is for checking whether a barrier layer composed of an oxide film that is formed by laser light irradiation and an oxide film formed from ozone water is capable of preventing the silicon film having a crystal structure from being doped with argon.

Figure 25:
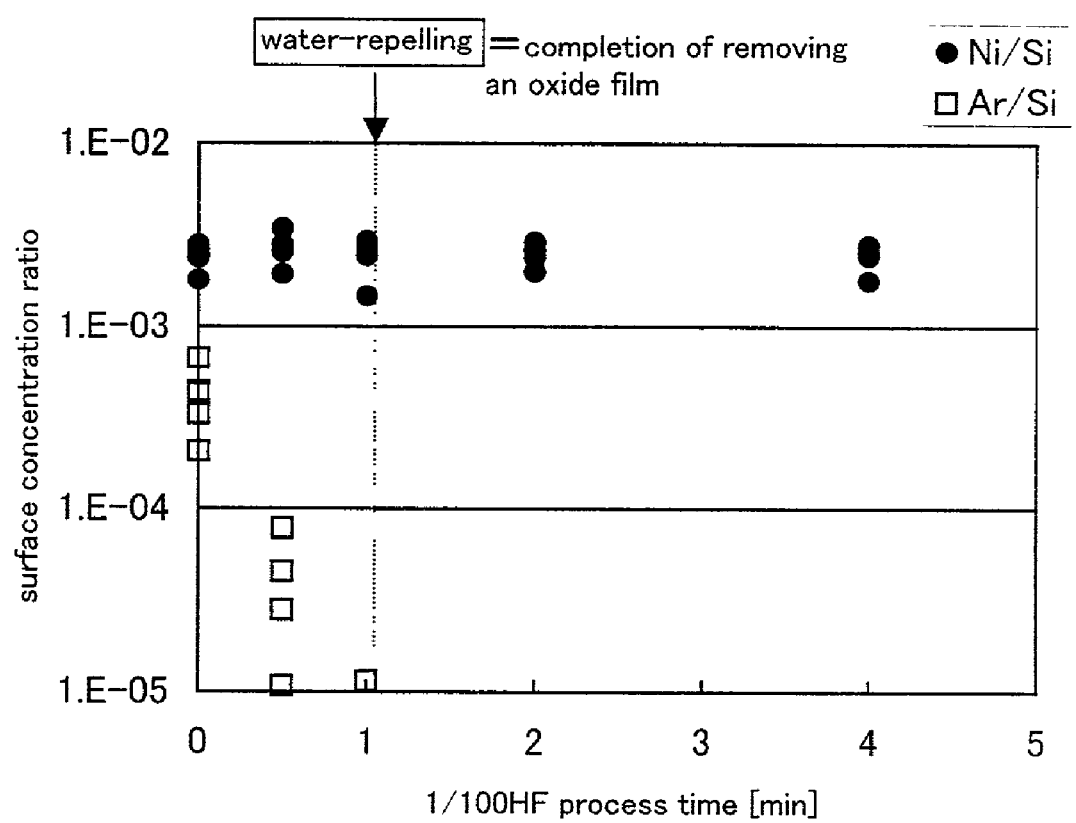
FIG. 25 is a graph showing changes in Ar concentration and Ni concentration in relation to an oxide film etching time.

To prepare a sample, a silicon oxynitride film is formed as a base insulating film (150 nm in thickness) on a quartz substrate, and a silicon film having a crystal structure is obtained in accordance with the procedure of Embodiment 11. Next, the film is irradiated with laser light (XeCl) in order to raise the crystallization ratio and repair defects remaining in crystal grains. An oxide film is formed through the above laser light irradiation. This oxide film and an oxide film formed by treating the surface with ozone water for 120 seconds together make a barrier layer that has a thickness of 1 to 5 nm in total. Next, an amorphous silicon film containing argon (50 nm in thickness) is formed by sputtering at a film formation pressure of 0.3 Pa. After the amorphous silicon film containing argon is removed, the argon/silicon concentration ratio and nickel/silicon concentration ratio on the surface of the barrier layer, i.e., oxide films, are measured by TXRF. The surface is treated with diluted fluoric acid (diluted to 1/100) for 30 seconds, 1 minute, 2 minutes, and 4 minutes to measure the argon/silicon concentration ratio and nickel/silicon concentration ratio by TXRF each time. The measurement results are shown in FIG. 25. It is confirmed that removal of the oxide films is achieved after 1 minute diluted fluoric acid treatment. FIG. 25 shows that the oxide film surface is heavily doped with argon. On the other hand, argon is not detected in the silicon film having a crystal structure. In short, it is proved that the barrier layer is successful in preventing the silicon film having a crystal structure from being doped with argon during the film formation by sputtering.

The nickel/silicon concentration ratio is almost constant ($1.4 \times 10^{-3}$ to $3 \times 10^{-3}$) in FIG. 25. These samples are not subjected to gettering and therefore high concentration of nickel is contained in their silicon films having a crystal structure.

For comparison, a sample having a different barrier layer is prepared. In this sample, the oxide film formed by laser light irradiation is removed and a barrier layer is formed by treating the surface with ozone water for 120 seconds. The same experiment is conducted on this sample to measure its argon/silicon concentration ratio by TXRF. As a result, a minute amount of argon is detected in its silicon film having a crystal structure.

The experiment results above prove that, in the above Embodiment Mode, the barrier layer composed of an oxide film that is formed by laser light irradiation and an oxide film that is formed by ozone water treatment is the optimum choice in preventing the silicon film having a crystal structure from being doped with argon.

Embodiment 14

In this embodiment, an experiment is conducted following the procedures below to compare, after gettering, a sample that receives laser light irradiation prior to formation of a gettering site with a sample that does not receive laser light irradiation prior to formation of a gettering site.

Figure 26:
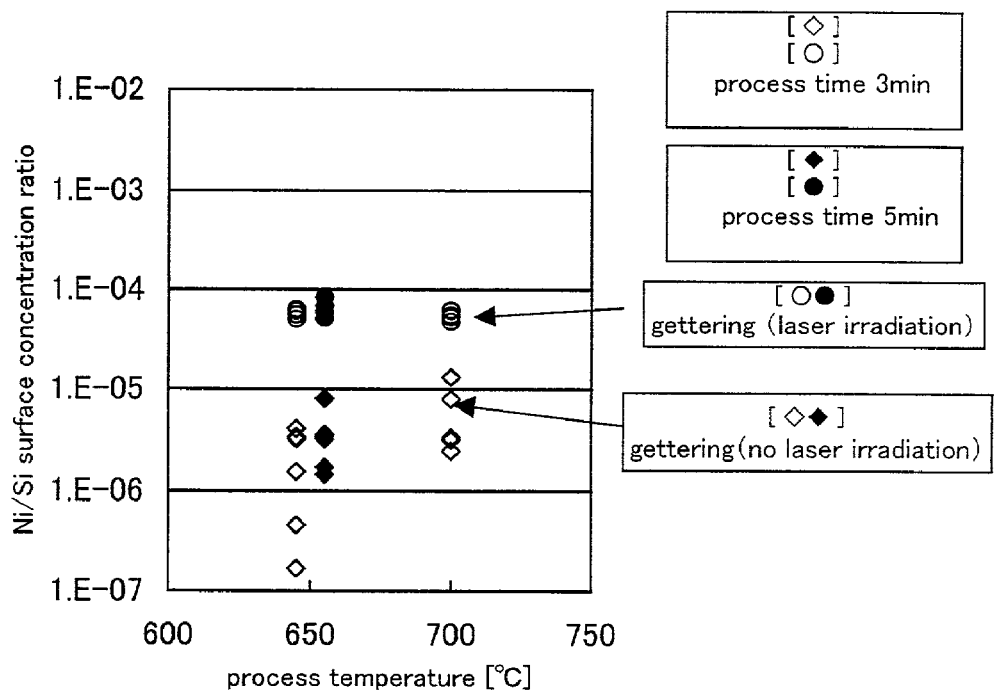
FIG. 26 is a graph showing a surface concentration ratio in a gettering site after gettering.

To prepare a sample, a silicon oxynitride film is formed as a base insulating film (150 nm in thickness) on a quartz substrate, and a silicon film having a crystal structure is obtained in accordance with the procedure of Embodiment 13. One sample is irradiated with laser light (XeCl) in order to raise the crystallization ratio and repair defects remaining in crystal grains. Another sample is left without receiving the laser light irradiation. Next, in both samples, an oxide film is formed by treating the surface with ozone water for 120 seconds to serve as a barrier layer. Subsequently, in both samples, an amorphous silicon film containing argon (50 nm in thickness) is formed by sputtering at a film formation pressure of 0.3 Pa. After the amorphous silicon film containing argon, which serves as a gettering site, is formed, the samples are irradiated with light from a lamp annealing apparatus for gettering under varying conditions; at 650° C. for 3 minutes, at 650° C. for 5 minutes, at 750° C. for 3 minutes, and at 750° C. for 5 minutes. The nickel/silicon concentration ratio on the surface of the gettering site is measured by TXRF in each sample. The measurement results are shown in FIG. 26. FIG. 26 shows that the sample subjected to laser irradiation has a nickel/silicon concentration ratio about one digit of magnitude higher than that of the sample subjected to no laser irradiation. Accordingly, a larger amount of nickel in the silicon film having a crystal structure is moved to the gettering site in the sample subjected to laser irradiation than in the sample subjected to no laser irradiation.

Figure 27:
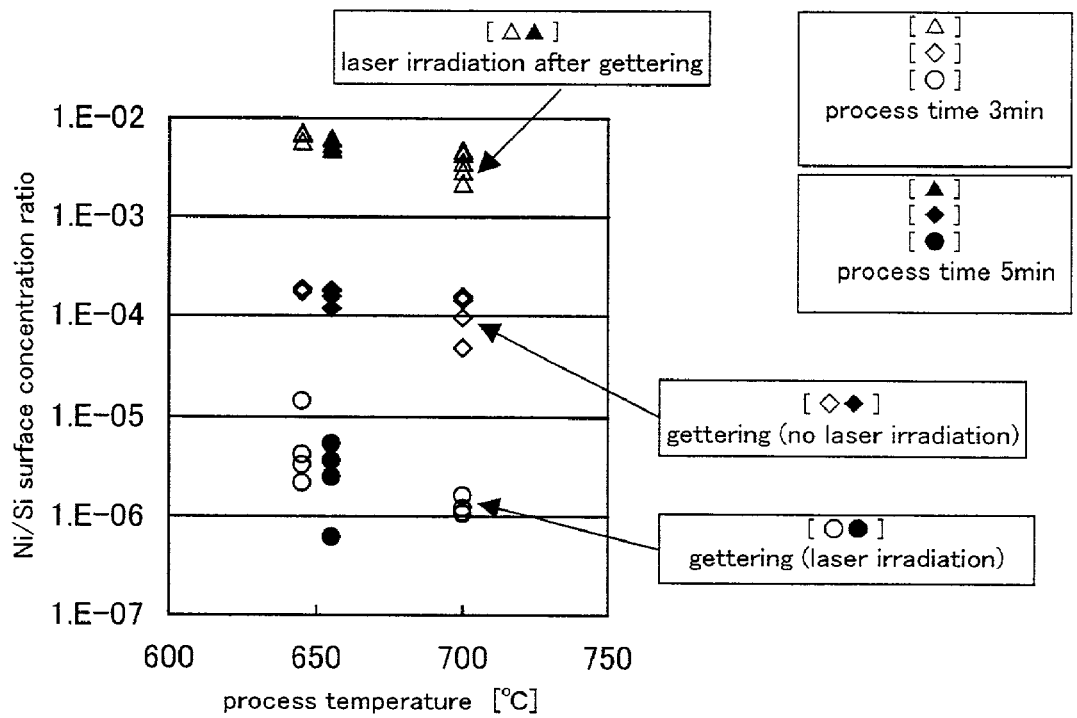
FIG. 27 is a graph showing a surface concentration ratio in a silicon film having a crystal structure after gettering.

After the gettering site and the barrier layer are removed, the nickel/silicon concentration ratio on the surface of the silicon film having a crystal structure is measured by TXRF in each sample. The measurement results are shown in FIG. 27. FIG. 27 shows that the sample subjected to laser irradiation has a nickel/silicon concentration ratio over one digit of magnitude lower than that of the sample subjected to no laser irradiation. It is once again proved that a larger amount of nickel in the silicon film having a crystal structure is moved to the gettering site in the sample subjected to laser irradiation than in the sample subjected to no laser irradiation. The nickel/silicon concentration ratio on the surface of the silicon film having a crystal structure is reduced more when the temperature is higher (750° C.) in the light irradiation by a lamp annealing apparatus. The nickel/silicon concentration ratio on the surface of the silicon film having a crystal structure is reduced more when the process time is longer (5 minutes) in the light irradiation by a lamp annealing apparatus.

It is concluded from these experiment results that the laser light irradiation increases the gettering effect and therefore the sample subjected to laser light irradiation is more desirable.

For comparison, the sample that has not received laser light irradiation is irradiated with laser light after the gettering site is removed. Then the nickel/silicon concentration ratio on the surface of its silicon film having a crystal structure is measured by TXRF. The results are shown in FIG. 27. In FIG. 27, the sample subjected to laser light irradiation after gettering exhibits even higher nickel/silicon concentration ratio (about one digit of magnitude higher) than that of the sample subjected to no laser light irradiation.

From these experiment results, it is the best to conduct laser light irradiation before gettering in order to increase the gettering effect.

Accordingly, in the above Embodiment Mode, the optimum step order for gettering is as follows:

forming an oxide film by laser light (XeCl) irradiation,
forming an oxide film by ozone water treatment to make a barrier layer from the two oxide films,
forming a gettering site, and
carrying out gettering.

As described above, the gettering method of the present invention in which forming the semiconductor film that contains a rare gas element into a laminate precedes heating has a very high gettering effect and effectively removes the metal element remaining in the semiconductor film that has a crystal structure. The present invention thus contributes not only to high purification of the semiconductor film having a crystal structure which is formed by using the metal element with a catalytic action but also to improvement of productivity of a semiconductor device which uses the semiconductor film having a crystal structure.

What is claimed is:

1. A method of manufacturing a semiconductor device comprising the steps of:
    forming a first amorphous semiconductor film on an insulating film;
    providing the first amorphous semiconductor film with a metal element;
    crystallizing the first amorphous semiconductor film to form a first crystalline semiconductor film;
    forming a barrier layer on a surface of the first crystalline semiconductor film;
    forming a second semiconductor film containing a rare gas element in a concentration of $1 \times 10^{19}$ to $1 \times 10^{22}$ atoms/cm$^3$ on the barrier layer;
    reducing a concentration of the metal element in the first crystalline semiconductor film by moving the metal element to the second semiconductor film; and
    removing the second semiconductor film.

2. The method of manufacturing the semiconductor device according to claim 1, wherein the insulating film comprises a silicon nitride film.

3. The method of manufacturing the semiconductor device according to claim 1, wherein a concentration of oxygen contained in the second semiconductor film is higher than a concentration of oxygen contained in the first crystalline semiconductor film.

4. The method of manufacturing the semiconductor device according to claim 1, wherein a concentration of oxygen contained in the first crystalline semiconductor film is $5 \times 10^{18}$/cm$^3$ or lower.

5. The method of manufacturing the semiconductor device according to claim 1, wherein the step forming the barrier layer is a step of oxidizing the surface of the first crystalline semiconductor film with a solution containing ozone.

6. The method of manufacturing the semiconductor device according to claim 1, wherein the step of forming the barrier layer is a step of oxidizing the surface of the first crystalline semiconductor film by an ultraviolet irradiation.

7. The method of manufacturing the semiconductor device according to claim 1, wherein the step forming the barrier layer is a step of oxidizing the surface of the first crystalline semiconductor film by a laser irradiation and then further oxidizing the surface of the first crystalline semiconductor film with a solution containing ozone.

8. The method of manufacturing the semiconductor device according to claim 1, wherein the metal element is one or more kinds of elements selected from the group consisting of Fe, Ni, Co, Ru, Rh, Pd, Os, Ir, Pt, Cu, and Au.

9. The method of manufacturing the semiconductor device according to claim 1, wherein the rare gas element is one or more kinds of elements selected from the group consisting of He, Ne, Ar, Kr, and Xe.

10. The method of manufacturing the semiconductor device according to claim 1, wherein an internal stress of the second semiconductor film is compressive stress.

11. The method of manufacturing the semiconductor device according to claim 1, wherein the semiconductor device is an EL display device.

12. The method of manufacturing the semiconductor device according to claim 1, wherein the semiconductor device is at least one selected from the group consisting of a personal computer, a video camera, a mobile computer, a goggle-type display, a player using a recording medium, a digital camera, a projector, a portable telephone, and a portable electronic book.

13. A method of manufacturing a semiconductor device comprising the steps of:
forming a first amorphous semiconductor film on an insulating film;
providing the first amorphous semiconductor film with a metal element;
crystallizing the first amorphous semiconductor film to form a first crystalline semiconductor film;
forming a barrier layer on a surface of the first crystalline semiconductor film;
forming a second semiconductor film containing a rare gas element in a concentration of $1\times10^{19}$ to $1\times10^{22}$ atoms/cm$^3$ on the barrier layer by a sputtering method;
reducing a concentration of the metal element in the first crystalline semiconductor film by moving the metal element to the second semiconductor film; and
removing the second semiconductor film.

14. The method of manufacturing the semiconductor device according to claim 13, wherein the insulating film comprises a silicon nitride film.

15. The method of manufacturing the semiconductor device according to claim 13, wherein a concentration of oxygen contained in the second semiconductor film is higher than a concentration of oxygen contained in the first crystalline semiconductor film.

16. The method of manufacturing the semiconductor device according to claim 13, wherein a concentration of oxygen contained in the first crystalline semiconductor film is $5\times10^{18}$/cm$^3$ or lower.

17. The method of manufacturing the semiconductor device according to claim 13, wherein the step of forming the barrier layer is a step of oxidizing the surface of the first crystalline semiconductor film with a solution containing ozone.

18. The method of manufacturing the semiconductor device according to claim 13, wherein the step of forming the barrier layer is a step of oxidizing the surface of the first crystalline semiconductor film by an ultraviolet irradiation.

19. The method of manufacturing the semiconductor device according to claim 13, wherein the step of forming the barrier layer is a step of oxidizing the surface of the first crystalline semiconductor film by a laser irradiation and then further oxidizing the surface of the first crystalline semiconductor film with a solution containing ozone.

20. The method of manufacturing the semiconductor device according to claim 13, wherein the metal element is one or more kinds of elements selected from the group consisting of Fe, Ni, Co, Ru, Rh, Pd, Os, Ir, Pt, Cu, and Au.

21. The method of manufacturing the semiconductor device according to claim 13, wherein the rare gas element is one or more kinds of elements selected from the group consisting of He, Ne, Ar, Kr, and Xe.

22. The method of manufacturing the semiconductor device according to claim 13, wherein an internal stress of the second semiconductor film is compressive stress.

23. The method of manufacturing the semiconductor device according to claim 13, wherein the sputtering is conducted by using a semiconductor containing phosphorus or boron as a target in an atmosphere containing the rare gas element.

24. The method of manufacturing the semiconductor device according to claim 13, wherein the semiconductor device is an EL display device.

25. The method of manufacturing the semiconductor device according to claim 13, wherein the semiconductor device is at least one selected from the group consisting of a personal computer, a video camera, a mobile computer, a goggle-type display, a player using a recording medium, a digital camera, a projector, a portable telephone, and a portable electronic book.

26. A method of manufacturing a semiconductor device comprising the steps of:
forming a first amorphous semiconductor film on an insulating film;
providing the first amorphous semiconductor film with a metal element;
crystallizing the first amorphous semiconductor film to form a first crystalline semiconductor film;
forming a barrier layer on a surface of the first crystalline semiconductor film;
forming a second semiconductor film containing a rare gas element in a concentration of $1\times10^{19}$ to $1\times10^{22}$ atoms/cm$^3$ and oxygen higher than $5\times10^{18}$/cm$^3$ on the barrier layer;
reducing a concentration of the metal element in the first crystalline semiconductor film by moving the metal element to the second semiconductor film; and
removing the second semiconductor film.

27. The method of manufacturing the semiconductor device according to claim 26, wherein the insulating film comprises a silicon nitride film.

28. The method of manufacturing the semiconductor device according to claim 26, wherein a concentration of oxygen contained in the second semiconductor film is higher than a concentration of oxygen contained in the first crystalline semiconductor film.

29. The method of manufacturing the semiconductor device according to claim 26, wherein a concentration of oxygen contained in the first crystalline semiconductor film is $5\times10^{18}$/cm$^3$ or lower.

30. The method of manufacturing the semiconductor device according to claim 26, wherein the step of forming the barrier layer is a step of oxidizing the surface of the first crystalline semiconductor film with a solution containing ozone.

31. The method of manufacturing the semiconductor device according to claim 26, wherein the step of forming the barrier layer is a step of oxidizing the surface of the first crystalline semiconductor film by an ultraviolet irradiation.

32. The method of manufacturing the semiconductor device according to claim 26, wherein the step of forming the barrier layer is a step of oxidizing the surface of the first crystalline semiconductor film by a laser irradiation and then further oxidizing the surface of the first crystalline semiconductor film with a solution containing ozone.

33. The method of manufacturing the semiconductor device according to claim 26, wherein the metal element is one or more kinds of elements selected from the group consisting of Fe, Ni, Co, Ru, Rh, Pd, Os, Ir, Pt, Cu, and Au.

34. The method of manufacturing, the semiconductor device according to claim 26, wherein the rare gas element is one or more kinds of elements selected from the group consisting of He, Ne, Ar, Kr, and Xe.

35. The method of manufacturing the semiconductor device according to claim 26, wherein an internal stress of the second semiconductor film is compressive stress.

36. The method of manufacturing the semiconductor device according to claim 26, wherein the semiconductor device is an EL display device.

37. The method of manufacturing the semiconductor device according to claim 26, wherein the semiconductor device is at least one selected from the group consisting of a personal computer, a video camera, a mobile computer, a goggle-type display, a player using a recording medium, a digital camera, a projector, a portable telephone, and a portable electronic book.

38. A method of manufacturing a semiconductor device comprising the steps of:
forming a first amorphous semiconductor film on an insulating film;
providing the first amorphous semiconductor film with a metal element;
crystallizing the first amorphous semiconductor film to form a first crystalline semiconductor film;
forming a barrier layer on a surface of the first crystalline semiconductor film;
forming a second semiconductor film containing a rare gas element on the barrier layer by a sputtering method;
irradiating the first crystalline semiconductor film with a light for 1 to 60 seconds so that a concentration of the metal element in the first crystalline semiconductor film is reduced by moving the metal element to the second semiconductor film; and
removing the second semiconductor film.

39. The method of manufacturing the semiconductor device according to claim 38, wherein the insulating film comprises a silicon nitride film.

40. The method of manufacturing the semiconductor device according to claim 38, wherein a concentration of oxygen contained in the second semiconductor film is higher than a concentration of oxygen contained in the first crystalline semiconductor film.

41. The method of manufacturing the semiconductor device according to claim 38, wherein a concentration of oxygen contained in the first crystalline semiconductor film is $5 \times 10^{18}/cm^3$ or lower.

42. The method of manufacturing the semiconductor device according to claim 38, wherein the step of forming the barrier layer is a step of oxidizing the surface of the first crystalline semiconductor film with a solution containing ozone.

43. The method of manufacturing the semiconductor device according to claim 38, wherein the step of forming the barrier layer is a step of oxidizing the surface of the first crystalline semiconductor film by an ultraviolet irradiation.

44. The method of manufacturing the semiconductor device according to claim 38, wherein the step of forming the barrier layer is a step of oxidizing the surface of the first crystalline semiconductor film by a laser irradiation and then further oxidizing the surface of the first crystalline semiconductor film with a solution containing ozone.

45. The method of manufacturing the semiconductor device according to claim 38, wherein the metal element is one or more kinds of elements selected from the group consisting of Fe, Ni, Co, Ru, Rh, Pd, Os, Ir, Pt, Cu, and Au.

46. The method of manufacturing the semiconductor device according to claim 38, wherein the rare gas element is one or more kinds of elements selected from the group consisting of He, Ne, Ar, Kr, and Xe.

47. The method of manufacturing the semiconductor device according to claim 38, wherein an internal stress of the second semiconductor film is compressive stress.

48. The method of manufacturing the semiconductor device according to claim 38, wherein the sputtering is conducted by using a semiconductor containing phosphorus or boron as a target in an atmosphere containing the rare gas element.

49. The method of manufacturing the semiconductor device according to claim 38, wherein the light is emitted from one selected from the group consisting of a halogen lamp, a metal halide lamp, a xenon arc lamp, a carbon arc lamp, a high-pressure sodium lamp, and a high-pressure mercury lamp.

50. The method of manufacturing the semiconductor device according to claim 38, wherein the semiconductor device is an EL display device.

51. The method of manufacturing the semiconductor device according to claim 38, wherein the semiconductor device is at least one selected from the group consisting of a personal computer, a video camera, a mobile computer, a goggle-type display, a player using a recording medium, a digital camera, a projector, a portable telephone, and a portable electronic book.

52. A method of manufacturing a semiconductor device comprising the steps of:
forming a first amorphous semiconductor film on an insulating film;
providing the first amorphous semiconductor film with a metal element;
crystallizing the first amorphous semiconductor film to form a first crystalline semiconductor film;
forming a barrier layer on a surface of the first crystalline semiconductor film;
forming a second semiconductor film containing a rare gas element and oxygen higher than $5 \times 10^{18}/cm^3$ on the barrier layer;
irradiating the first crystalline semiconductor film with a light for 1 to 60 seconds so that a concentration of the metal element in the first crystalline semiconductor film is reduced by moving the metal element to the second semiconductor film; and
removing the second semiconductor film.

53. The method of manufacturing the semiconductor device according to claim 52, wherein the insulating film comprises a silicon nitride film.

54. The method of manufacturing the semiconductor device according to claim 52, wherein a concentration of oxygen contained in the second semiconductor film is higher than a concentration of oxygen contained in the first crystalline semiconductor film.

55. The method of manufacturing the semiconductor device according to claim 52, wherein a concentration of oxygen contained in the first crystalline semiconductor film is $5 \times 10^{18}/cm^3$ or lower.

56. The method of manufacturing the semiconductor device according to claim 52, wherein the step of forming the barrier layer is a step of oxidizing the surface of the first crystalline semiconductor film with a solution containing ozone.

57. The method of manufacturing the semiconductor device according to claim 52, wherein the step of forming the barrier layer is a step of oxidizing the surface of the first crystalline semiconductor film by an ultraviolet irradiation.

58. The method of manufacturing the semiconductor device according to claim 52, wherein the step of forming the barrier layer is a step of oxidizing the surface of the first crystalline semiconductor film by a laser irradiation and then further oxidizing the surface of the first crystalline semiconductor film with a solution containing ozone.

59. The method of manufacturing the semiconductor device according to claim 52, wherein the metal element is one or more kinds of elements selected from the group consisting of Fe, Ni, Co, Ru, Rh, Pd, Os, Ir, Pt, Cu, and Au.

60. The method of manufacturing the semiconductor device according to claim 52, wherein the rare gas element is one or more kinds of elements selected from the group consisting of He, Ne, Ar, Kr, and Xe.

61. The method of manufacturing the semiconductor device according to claim 52, wherein an internal stress of the second semiconductor film is compressive stress.

62. The method of manufacturing the semiconductor device according to claim 52, wherein the light is emitted from one selected from the group consisting of a halogen lamp, a metal halide lamp, a xenon arc lamp, a carbon arc lamp, a high-pressure sodium lamp, and a high-pressure mercury lamp.

63. The method of manufacturing the semiconductor device according to claim 52, wherein the semiconductor device is an EL display device.

64. The method of manufacturing the semiconductor device according to claim 52, wherein the semiconductor device is at least one selected from the group consisting of a personal computer, a video camera, a mobile computer, a goggle-type display, a player using a recording medium, a digital camera, a projector, a portable telephone, and a portable electronic book.

* * * * *